(12) United States Patent
Ozawa

(10) Patent No.: US 7,357,026 B2
(45) Date of Patent: Apr. 15, 2008

(54) ACCELERATION SENSOR

(75) Inventor: Nobuo Ozawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 127 days.

(21) Appl. No.: 11/063,551

(22) Filed: Feb. 24, 2005

(65) Prior Publication Data

US 2005/0268717 A1    Dec. 8, 2005

(30) Foreign Application Priority Data

Jun. 3, 2004    (JP) .............................. 2004-166007

(51) Int. Cl.
*G01P 15/12*    (2006.01)
(52) U.S. Cl. ................. 73/514.33; 73/514.38
(58) Field of Classification Search ............. 73/514.33, 73/514.38
See application file for complete search history.

(56) References Cited

U.S. PATENT DOCUMENTS

| | | | | |
|---|---|---|---|---|
| 5,121,633 A | * | 6/1992 | Murakami et al. ....... | 73/514.16 |
| 5,520,051 A | * | 5/1996 | Fujii et al. .............. | 73/514.36 |
| 5,528,937 A | * | 6/1996 | Dufour ................... | 73/514.32 |
| 7,107,847 B2 | * | 9/2006 | Yoshida et al. ......... | 73/514.33 |
| 2003/0209075 A1 | * | 11/2003 | Okada .................... | 73/514.16 |

FOREIGN PATENT DOCUMENTS

| | | | |
|---|---|---|---|
| JP | 8-327656 A | * | 12/1996 |
| JP | 2002-296293 | | 10/2002 |
| JP | 2004-198243 | | 7/2004 |

\* cited by examiner

*Primary Examiner*—John E. Chapman
(74) *Attorney, Agent, or Firm*—Rabin & Berdo, PC

(57) ABSTRACT

An acceleration sensor includes a base portion shaped into the form of a frame, a weight portion located inside the base portion and disposed away from the base portion, a flexible beam portion disposed over an upper portion of the base portion and an upper portion of the weight portion and a stopper portion disposed above the base portion and disposed over the weight portion away from the weight portion, wherein the stopper portion restricts an amount of displacement of the weight portion in the direction of the stopper portion.

26 Claims, 14 Drawing Sheets

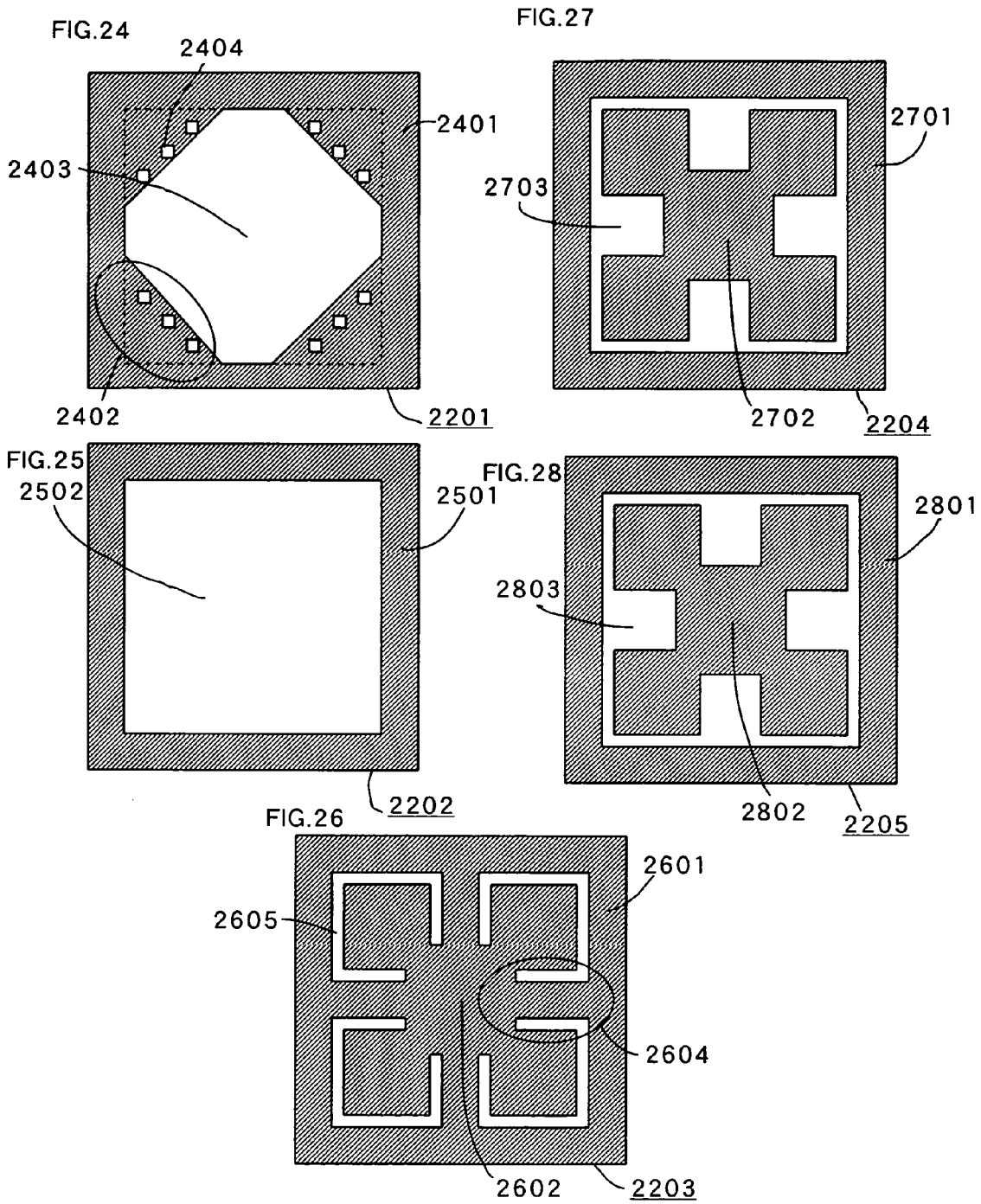

3701
3702
3703
A
A'

3804    3805    3803
3801    3802

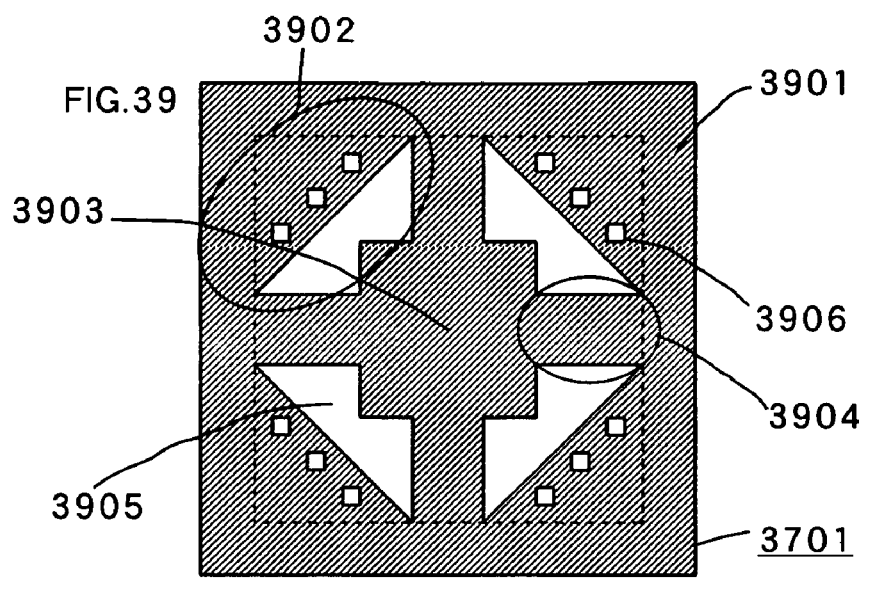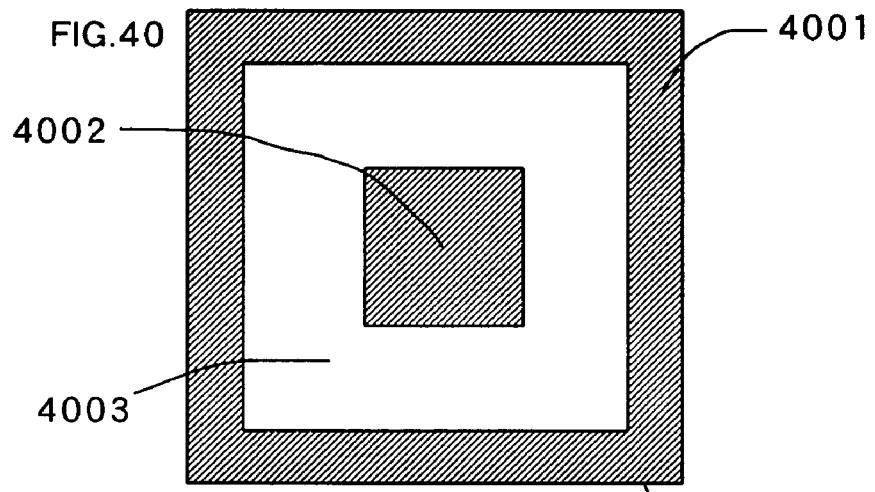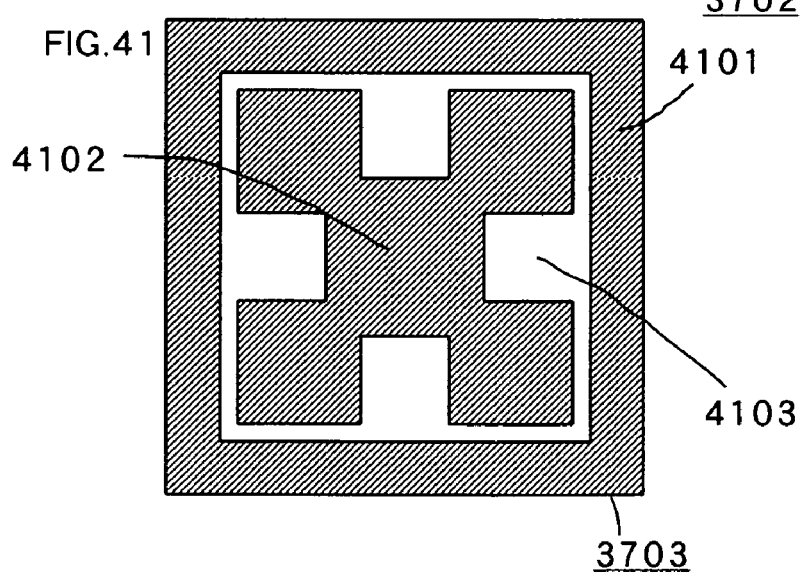

4804  4802  4803  4801  A'

4904   4905   4903

4901   4902

ACCELERATION SENSOR

BACKGROUND OF THE INVENTION

1. Field of the Invention

The present invention relates to a three-dimensional acceleration sensor, and particularly to a technique for improving sensitivity and impact resistance of an acceleration sensor manufactured by a micro-fabrication process.

2. Description of the Related Art

A conventional three-dimensional acceleration sensor generally comprises a weight portion, a base portion provided around the weight portion, and beam portions each of which movably connects the weight portion and the base portion and is provided with a strain detection part, all of which are formed in a laminated substrate. The acceleration sensor detects the displacement of the weight portion through the strain detection part of each beam portion to thereby determine acceleration. Although a patent document 1 (Japanese Laid-Open Patent No. 2002-296293) has disclosed that the sensitivity of an acceleration sensor is improved by increasing the mass of a weight portion. The conventional three-dimensional acceleration sensor described in the patent document 1 discloses that the mass of the weight portion is increased to improve the sensitivity of the acceleration sensor. Since, however, the acceleration sensor per se is also brought into less size with advances in its miniaturization, an increase in the mass of the weight portion is becoming difficult correspondingly. Thus, a problem arose in that the improvement in sensitivity by the mass of the weight portion was becoming difficult. Also a problem arose in that when much acceleration was applied in a vertical direction with the increase in the mass of the weight portion, the amount of displacement of the weight portion exceeded the allowable amount of displacement of a beam portion and varied, thereby causing breakage of the acceleration sensor. These got in the way of improving the sensitivity of the acceleration sensor and bringing it into less size. In addition, the patent document 1 does not disclose a stopper portion and a detailed manufacturing process for the acceleration sensor.

On the other hand, a patent document 2 (Japanese Laid-Open Patent No. 2004-198243) discloses that the thicknesses of beam portions and stopper portions in the vertical direction are identical. The conventional acceleration sensor described in the patent document 2 does not take up a problem about means for improving the sensitivity while having high impact resistance because the stopper portions and the beam portions are identical in thickness.

SUMMARY OF THE INVENTION

An acceleration sensor according to an aspect of the present invention includes: a base portion shaped into the form of a frame; a weight portion located inside the base portion and disposed away from the base portion; flexible beam portions disposed over an upper portion of the base portion and an upper portion of the weight portion; and stopper portions disposed above the base portion and disposed over the weight portion away from the weight portion, said stopper portions each restricting an amount of displacement of the weight portion in the direction of each stopper portion.

A method of manufacturing an acceleration sensor according to an aspect of the present invention includes: preparing a laminated substrate having a first layer, a second layer, a third layer, a fourth layer, a fifth layer and a sixth layer which are laminated from above in that order with their upper surfaces being directed in the same direction and the first layer being set as a top layer, said respective layers having upper surfaces and lower surfaces opposite to the upper surfaces, said upper surfaces each including a first area, a second area which surrounds the first area, a third area which makes contact with the second area, and a fourth area which surrounds the second and third areas, said lower surfaces each including a fifth area, a sixth area which surrounds the fifth area away from the fifth area and which is identical in shape to the fourth area of the upper surface and disposed directly below the fourth area and in the same position, a seventh area which connects the fifth area and the sixth area, and an eighth area adjacent to the fifth, sixth and seventh areas; removing the first and second layers each lying in the first area from the upper surface side to form a first hole portion; removing the first and second layers each lying in the third area from the upper surface side to form a second hole portion; removing the second layer in the second area through the first hole portion and the second hole portion; removing the sixth layer in the fifth, seventh and eighth areas from the lower surface side to form a third hole portion; removing the fifth layer in the eighth area through the third hole portion to form a fourth hole portion; removing the fourth layer in the eighth area except for the fifth and seventh areas through the third and fourth hole portions to form a fifth hole portion; removing the third layer in the eight area excluding the fifth and seventh areas through the third, fourth and fifth hole portions, and the fifth layer in the seventh area through the third hole portion; and removing the second layer in the eighth area excluding the fifth and seventh areas through the third, fourth, fifth and sixth hole portions, and the fourth layer in the seventh area through the third and fourth hole portions.

BRIEF DESCRIPTION OF THE DRAWINGS

FIG. 24 is a top view illustrating a first semiconductor layer of the acceleration sensor according to the second embodiment of the present invention.

FIG. 25 is a top view depicting a first insulator layer of the acceleration sensor according to the second embodiment of the present invention.

FIG. 26 is a top view showing a second semiconductor layer of the acceleration sensor according to the second embodiment of the present invention.

FIG. 27 is a top view illustrating a second insulator layer of the acceleration sensor according to the second embodiment of the present invention.

FIG. 28 is a top view showing a third semiconductor layer of the acceleration sensor according to the second embodiment of the present invention.

FIG. 39 is a top view illustrating a first semiconductor layer of the acceleration sensor according to the third embodiment of the present invention.

FIG. 40 is a top view depicting a first insulator layer of the acceleration sensor according to the third embodiment of the present invention.

FIG. 41 is a top view showing a second semiconductor layer of the acceleration sensor according to the third embodiment of the present invention.

DETAILED DESCRIPTION OF THE PREFERRED EMBODIMENTS

Preferred embodiments of the present invention will hereafter be described with reference to the accompanying drawings. Incidentally, the drawings merely schematically show the size, shape and positional relationships of respective components to such a degree that the present invention can be understood. Thus, the present invention is not limited to the embodiments in particular. Although the expression of "in the vertical direction" is used, it means the direction normal to a bonding surface at the time that a plurality of layers are laminated on one another. Further, although specific materials, conditions and numerical conditions are used in the following description, they are merely one preferred example. Thus, the present invention is by no means limited to them.

Incidentally, an acceleration sensor and a manufacturing process thereof can be formed by the conventional known means such as etching or the like, using the conventional known materials such as the silicon substrate, etc. Thus, the detailed description of these materials and means might be omitted.

First Preferred Embodiment

An acceleration sensor according to a first embodiment of the present invention will hereinafter be described with reference to FIGS. 1 through 9.

Figure 1:
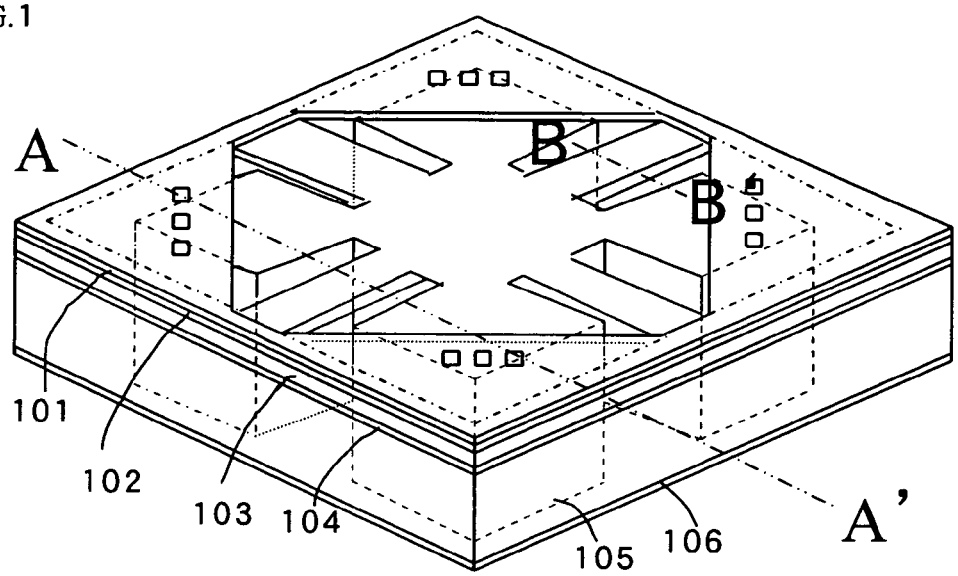
FIG. 1 is a perspective view showing an acceleration sensor according to a first embodiment of the present invention.
Figure 2:
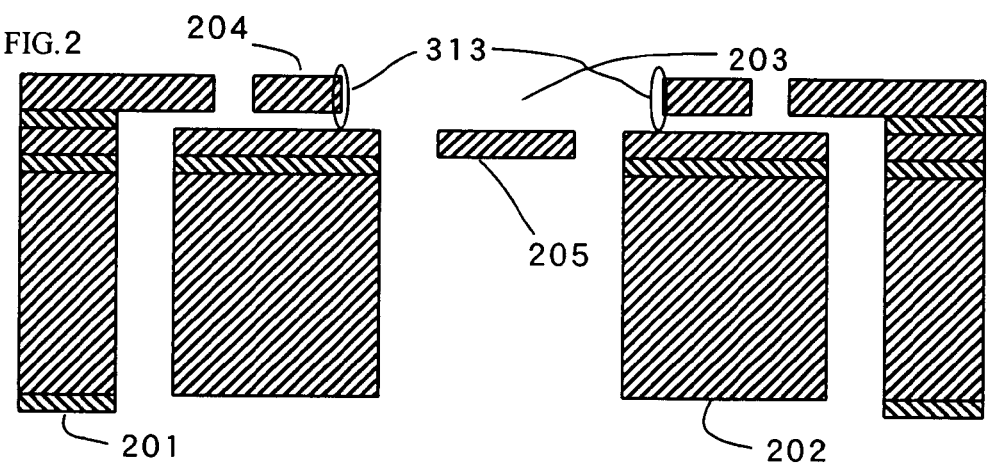
FIG. 2 is a cross-sectional view taken along line A-A' in FIG. 1.
Figure 3:
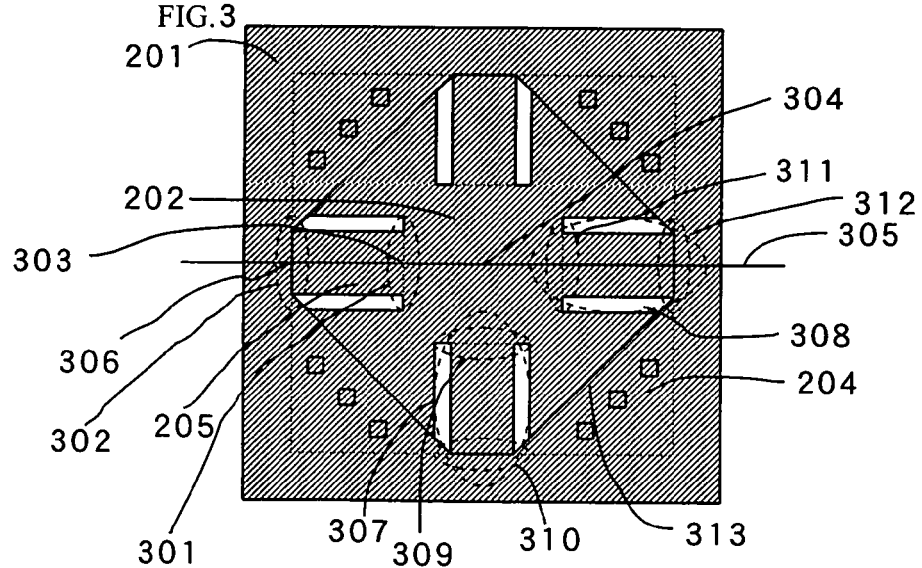
FIG. 3 is a top view showing the acceleration sensor of the present invention.

FIG. 1 is a perspective view showing the acceleration sensor according to the first embodiment of the present invention. FIG. 2 is a cross-sectional view taken along line A-A', of the acceleration sensor of the present invention, which is shown in FIG. 1. FIG. 3 is a top view showing the acceleration sensor of the present invention, which is shown in FIG. 1.

As shown in FIG. 2, the acceleration sensor according to the first embodiment of the present invention comprises a base portion 201, a weight portion 202, an opening 203, stopper portions 204 and beam portions 205. The base portion 201 has a structure in which through holes are defined in an SOI wafer.

The base portion 201 is of a laminated substrate having square upper and lower surfaces. The base portion 201 includes a first area in which the opening 203 extending through the upper to lower surfaces, and a second area that surrounds the first area. The base portion 201 includes an inner wall formed at a boundary surface between the first area and the second area.

The weight portion 202 is formed within the opening 203 formed in the first area of the base portion 201 and disposed away from the inner wall of the base portion 201. The weight portion 202 is of a laminated substrate having square upper and lower surfaces and side surfaces. A concave portion extending from the upper and lower surfaces is formed in the central part of each side surface of the weight portion 202.

The beam portions 205 are formed in plural fashion and formed over the upper portions of the inner wall of the base portion 201 and the upper portions of the weight portion 202. Here, the shape of each beam portion 205 will be explained using FIG. 3 showing the top view of the acceleration sensor of the present invention. The beam portion 205 has a first end 301 corresponding to one end of the beam portion 205 on the side connected to the weight portion 202 and includes a second end 302 corresponding to the other end of the beam portion 205 on the side connected to the base portion 201. A first point 303 is a virtual point that exists in the central part of the first end 301. A second point 306 is a virtual point that exists in the central part of the second end 302. A center point 304 is a virtual point that exists in the central part of the weight portion 202. A straight line 305 is defined as a virtual straight line that connects the first point 303 and the center point 304. The straight line 305 intersects the second point 306. The beam portion 205 has a shape containing a line segment that connects the first point 303 and the second point 306 and is formed so as to extend to the base portion 201 and the weight portion 202. Here, the first end 301 of the beam portion 205 is connected to its corresponding concave portion formed in the side surface of the weight portion 202. When the weight portion 202 is displaced by acceleration, each of the beam portions 205 is flexibly displaced in association with it. A piezo resistive element is formed on the beam portion 205. When the beam portion 205 is flexibly displaced, the resistance of the piezo resistive element varies to detect acceleration. Since the piezo resistive element is electrically connected to its corresponding electrode pad formed in the upper surface of the base portion 201, a signal can be transmitted from the electrode pad to an external device under the detected acceleration (not shown). Since a structure formed with no weight portion 202 is taken below the beam portions 205, the weight portion 202 and the beam portions 205 do not collide with one another even when the weight portion 202 is displaced in the vertical direction, so that the beam portions 205 can be prevented from being damaged. Incidentally, the thickness of each beam portion 205 is configured so as to be thinner than the thickness of the stopper portion 204.

As shown in FIG. 2, the stopper portion 204 is formed above the base portion 201 and disposed away from the weight portion 202 above the weight portion 202. Here, the thickness of the stopper portion 204 is thicker than the thickness of the beam portion 205. The shape of the stopper portion 204 will be explained using FIG. 3 corresponding to the top view of the acceleration sensor of the present invention. One of the plurality of beam portions 205 is configured as a first beam portion 307 and another one thereof is configured as a second beam portion 308 formed in the neighborhood of the first beam portion 307. The first beam portion 307 includes a third end 309 corresponding to one end on the side connected to the weight portion 202, and a fourth end 310 corresponding to the other end on the side connected to the base portion 201. The second beam portion 308 includes a fifth end 311 corresponding to one end on the side connected to the weight portion 202 and a sixth end 312 corresponding to the other end on the side connected to the base portion 201. The stopper portion 204 has a first side 313 that connects the fourth end 310 of the first beam portion 307 and the sixth end 312 of the second beam portion 308 and constitutes the base portion 201. Here, the first side is formed on the plane parallel to the upper surface of the base portion 201. The first side 313 and a layer containing the first side 313 protrudes toward the weight portion 202 and constitutes the stopper portion 204. Here, the position of the first side 313 may be placed in a position where the fourth end 310 of the first beam portion 307 and the sixth end 312 of the second beam portion 308 are connected, as viewed in the top view. That is, the position of the first side 313 is not limited to a layer which constitutes each beam portion 205. The first side 313 may be located in a layer formed above the layer constituting the beam portion 205.

The acceleration sensor according to the first embodiment of the present invention takes an SOI structure.

As shown in FIG. 1, the acceleration sensor according to the first embodiment of the present invention has an SOI (Silicon On Insulator) structure obtained by laminating a first semiconductor layer 101, a first insulator layer 102, a second semiconductor layer 103, a second insulator layer 104, a third semiconductor layer 105, and a third insulator layer 106 on one another. The third insulator layer 106 is of the bottom or lowermost layer and is formed of a silicon oxide film having a thickness of 2 μm, for example. The third semiconductor layer 105 is disposed directly above the third insulator layer 106 and is formed of a silicon layer having a thickness of 500 μm, for example. The second insulator layer 104 is placed directly above the third semiconductor layer 105 and is made up of a silicon oxide film having a thickness of 4 μm, for example. The second semiconductor layer 103 is disposed directly above the second insulator layer 104 and is formed of a silicon layer having a thickness of 5 μm, for example. The first insulator film 102 is placed directly above the second semiconductor layer 103 and is composed of a silicon oxide film having a thickness of 2 μm, for example. The first semiconductor layer 101 is of the uppermost layer, and is disposed directly above the first insulator layer 102 and formed of a silicon layer having 15 μm, for example.

The structure of the acceleration sensor according to the first embodiment of the present invention will be explained every layers.

Figure 4:
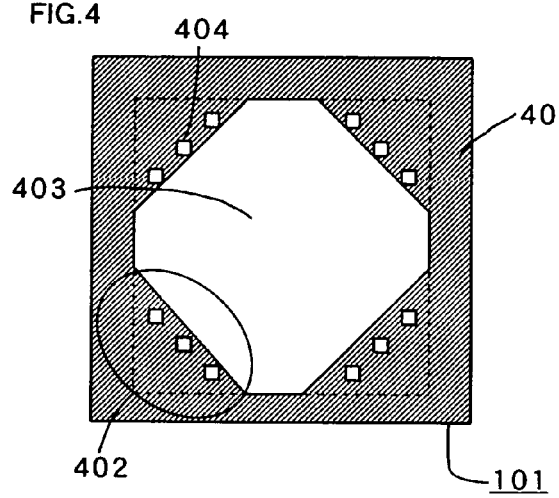
FIG. 4 is a top view illustrating a first semiconductor layer of the acceleration sensor according to the first embodiment of the present invention.

FIG. 4 is a top view showing the first semiconductor layer 101 corresponding to the top layer of the acceleration sensor of the present invention. As shown in FIG. 4, the first semiconductor layer 101 is rectangular in shape and includes a first area, a second area that surrounds the first area, a third area that surrounds the second area, and a fourth area that surrounds the second area and the third area. The first semiconductor layer 101 comprises a frame portion 401 formed in the fourth area, stopper portions 402 each formed in the second area, a hole portion 403 defined in the third area, and etching openings 404 defined in the first area. The frame portion 401 is shaped in the form of a frame having a predetermined thickness in the center direction from its outer edge sides. Here, the frame portion 401 corresponds to one of plural layers constituting the base portion 201 and is equivalent to the top layer of the base portion 201. The stopper portions 402 have triangular shapes and are placed at the four inner corners of the frame portion 401 in such a manner that the two sides of the triangles are connected to the inner sides of the frame portion 401. The hole portion 403 is a space surrounded by the frame portion 401 and the stopper portions 402. Here, the hole portion 403 is part that constitutes the opening 203. The etching openings 404 are a plurality of small through holes defined to allow etchant to pass therethrough and etch lower layers of the stopper portions 402.

Figure 5:
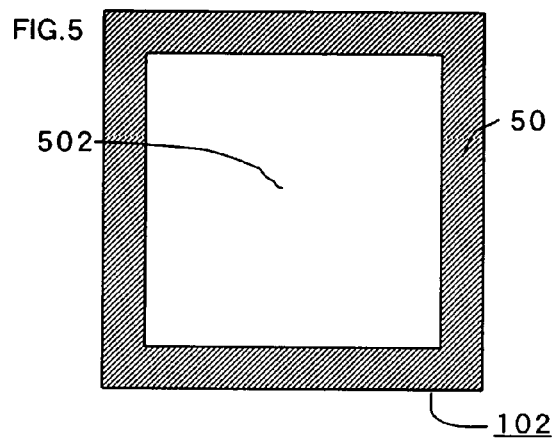
FIG. 5 is a top view depicting a first insulator layer of the acceleration sensor according to the first embodiment of the present invention.

FIG. 5 is a top view showing the first insulator layer 102 of the acceleration sensor of the present invention. As shown in FIG. 5, the first insulator layer 102 is rectangular in shape and has a first area and a second area that surrounds the first area. Here, the first area of the first insulator layer 102 corresponds to an area obtained by combining the first, second and third areas of the first semiconductor layer 101 together. Also the second area of the first insulator layer 102 corresponds to the fourth area of the first semiconductor layer 101. The first insulator layer 102 comprises a frame portion 501 formed in the first area and a hole portion 502 defined in the second area. The frame portion 501 is shaped in the form of a frame having a predetermined thickness in the center direction from its outer edge portions. Here, the frame portion 501 corresponds to one of the plural layers that constitute the base portion 201 and is placed directly below the frame portion 401. The hole portion 502 is a space surrounded by the frame portion 501. Here, the hole portion 502 is part that constitutes the opening 203 and is located below the hole portion 403.

Figure 6:
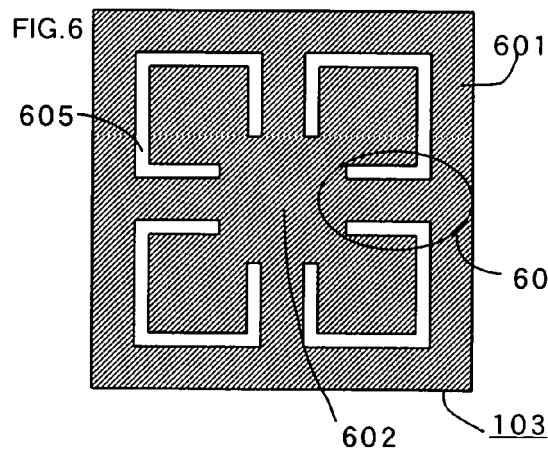
FIG. 6 is a top view showing a second semiconductor layer of the acceleration sensor according to the first embodiment of the present invention.

FIG. 6 is a top view showing the second semiconductor layer 103 of the acceleration sensor of the present invention. As shown in FIG. 6, the second semiconductor layer 103 is rectangular in shape and has a first area, a second area that surrounds with being spaced away from the first area, a third area that connects the first area and the second area, and a fourth area surrounded by the first, second and third areas. The second semiconductor layer 103 comprises a frame portion 601 formed in the second area, a weight portion 602 formed in the first area, beam portions 604 each formed in the third area and hole portions 605 each defined in the fourth area. The frame portion 601 is shaped in the form of a frame having a predetermined thickness in the center direction from its outer edge portions. Here, the frame portion 601 corresponds to one of the plural layers that constitute the base portion 201 and is located directly below the frame portion 501. The weight portion 602 has shapes with concave portions defined in the central parts of their square sides. Here, the weight portion 602 is part of layers that constitute the weight portion 202 and corresponds to the uppermost layer of the weight portion 202. Each of the beam portions 604 is rectangular in shape and connects the frame portion 601 and the weight portion 602. Here, the beam portions 604 are connected to their corresponding concave portions of the weight portion 602. The hole portions 605 are shaped along the outer sides of the weight portion 602 and are spaces respectively surrounded by the frame portion 601, the weight portion 602 and the beam portions 604. Here, the hole portions 605 are parts of the opening 203 and are placed below the hole portion 502.

Figure 7:
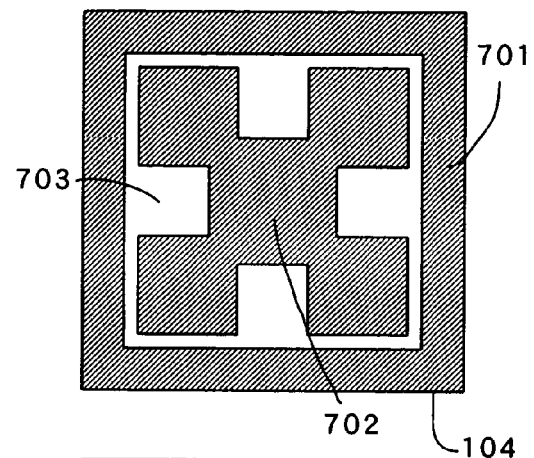
FIG. 7 is a top view illustrating a second insulator layer of the acceleration sensor according to the first embodiment of the present invention.

FIG. 7 is a top view showing the second insulator layer 104 of the acceleration sensor of the present invention. As shown in FIG. 7, the second insulator layer 104 is rectangular in shape and has a first area, a second area that surrounds the first area, and a third area that surrounds the second area. Here, the first area of the second insulator layer 104 corresponds to the first area of the second semiconductor layer 103. The second area of the second insulator layer 104 corresponds to an area obtained by combining the third and fourth areas of the second semiconductor layer 103. The third area of the second insulator layer 104 corresponds to the second area of the second semiconductor layer 103. The second insulator layer 104 comprises a frame portion 701 formed in the third area, a weight portion 702 formed in the first area, and hole portions 703 formed in the second area. The frame portion 701 is shaped in the form of a frame having a predetermined thickness in the center direction from its outer edge portions. Here, the frame portion 701 corresponds to one of the plural layers of the base portion 201 and is placed directly below the frame portion 601. The weight portion 702 has shapes having concave portions defined in the central parts of the respective square sides thereof. Here, the weight portion 702 corresponds to one of the plural layers that constitute the weight portion 202 and is located directly below the weight portion 602. Each of the hole portions 703 is formed along the outer side of the weight portion 702 and is a space surrounded by the frame portion 701 and the weight portion 702. Here, each hole portion 703 is part of the opening 203 and located below the hole portion 605.

Figure 8:
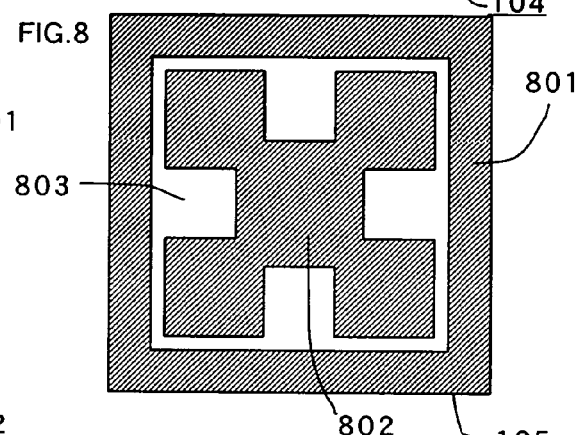
FIG. 8 is a top view showing a third semiconductor layer of the acceleration sensor according to the first embodiment of the present invention.

FIG. 8 is a top view showing the third semiconductor layer 105 of the acceleration sensor of the present invention. As shown in FIG. 8, the third semiconductor layer 105 is rectangular in shape and has a first area, a second area that surrounds the first area, and a third area that surrounds the second area. Here, the first area of the third semiconductor layer 105 corresponds to the first area of the second insulator layer 104. The second area of the third semiconductor layer 105 corresponds to the second area of the second insulator layer 104. The third area of the third semiconductor layer 105 corresponds to the third area of the second insulator layer 104. The third semiconductor layer 105 comprises a frame portion 801 formed in the third area, a weight portion 802 formed in the first area, and hole portions 803 each formed in the second area. The frame portion 801 is shaped in the form of a frame having a predetermined thickness in the center direction from its outer edge portions. Here, the frame portion 801 corresponds to one of the plural layers that constitute the base portion 201 and is placed directly below the frame portion 701. The weight portion 802 has shapes having concave portions defined in the central parts of the respective square sides. Here, the weight portion 802 corresponds to one of the plural layers constituting the weight portion 202 and is of the lowermost layer of the weight portion 202. The weight portion 802 is located directly below the weight portion 702. The hole portions 803 are defined along the outer sides of the weight portion 802 and are respectively spaces surrounded by the frame portion 801 and the weight portion 802. Here, the hole portions 803 are placed below the hole portions 703 respectively.

Figure 9:
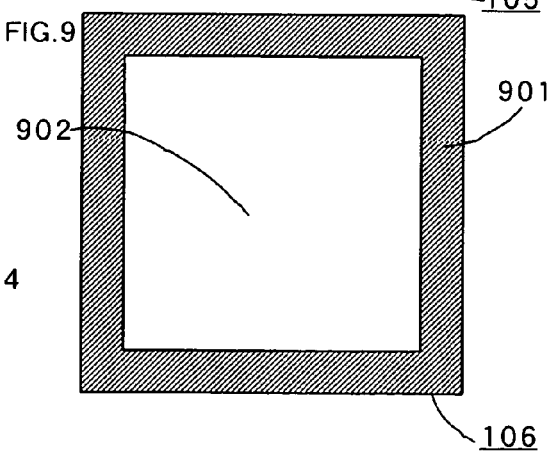
FIG. 9 is a top view illustrating a third insulator layer of the acceleration sensor according to the first embodiment of the present invention.

FIG. 9 is a top view showing the third insulator layer 106 of the acceleration sensor of the present invention. As shown in FIG. 9, the third insulator layer 106 is rectangular and has a first area and a second area that surrounds the first area. Here, the first area of the third insulator layer 106 corresponds to the first area of the first insulator layer 102. The second area of the third insulator layer 106 corresponds to the second area of the first insulator layer 102. The third insulator layer 106 comprises a frame portion 901 formed in the second area and a hole portion 902 defined in the first area. The frame portion 901 is shaped in the form of a frame having a predetermined thickness as viewed from its outer edge portions. Here, the frame portion 901 corresponds to one of the plural layers that constitute the base portion 201 and is of the bottom layer thereof. The hole portion 902 is a space surrounded by the frame portion 901. Here, the hole portion 902 is located below the hole portions 803.

The base portion 201 of the acceleration sensor according to the first embodiment of the present invention comprises the frame portion 401 of the first semiconductor layer 101, the frame portion 501 of the first insulator layer 102, the frame portion 601 of the second semiconductor layer 103, the frame portion 701 of the second insulator layer 104, the frame portion 801 of the third semiconductor layer 105, and the frame portion 901 of the third insulator layer 106. The base portion 201 constitutes the side surfaces of the acceleration sensor of the present invention. The weight portion 202 comprises the weight portion 602 of the second semiconductor layer 103, the weight portion 702 of the second insulator layer 104 and the weight portion 802 of the third semiconductor layer 105 and is disposed inside the base portion 201. The weight portion 202 is a rectangular parallelepiped having upper, lower and side surfaces. The upper surface thereof is connected to the beam portions 205, and the side surfaces thereof are formed with concave portions defined in the central parts from the upper surface to the lower surface. The opening 203 with the stopper portions 204 and the beam portions 205 formed therein is formed by the hole portion 403 corresponding to a component of the first semiconductor layer 101, the hole portion 502 corresponding to a component of the first insulator layer 102, and the hole portions 605 corresponding to components of the second semiconductor layer 103. The opening 203 is a space surrounded by the base portion 201, the weight portion 202, the stopper portions 204 and the beam portions 205. Each of the stopper portions 204 formed by the opening 203 is formed in the first semiconductor layer 101 and shaped in triangular form so as to cover the corners of the base portion 201 shaped in frame form. Each of the beam portions 205 formed by the opening 203 is formed in the second semiconductor layer 103 and shaped in rectangular form so as to connect the base portion 201 and the weight portion 202.

The acceleration sensor according to the first embodiment of the present invention has the effect that since the provision of the stopper portions above the weight portion makes it possible to restrict the amount of displacement of a weight by virtue of the stopper portions even if the weight intends to greatly vary in the vertical direction, impact resistance in the vertical direction is enhanced as compared with the conventional acceleration sensor. The acceleration sensor also has the effect that providing the beam portions so as not to provide the stopper portions above the beam portions prevents the beam portions from colliding with the stopper portions and being damaged when the weight portion is displaced under acceleration and the beam portions are displaced correspondingly. Further, the acceleration sensor has the effect that since the first semiconductor layer is set thicker than the second semiconductor layer and their thicknesses can be designed arbitrarily, impact resistance can be enhanced by making the stopper portions thick and the sensitivity of the acceleration sensor can be improved by making the beam portions thin.

Manufacturing Method

A method of manufacturing the acceleration sensor according to the first embodiment of the present invention will be explained below using FIG. 1 and FIGS. 10 through 17.

A method of manufacturing the acceleration sensor using the laminated substrate shown in FIG. 1, i.e., a method of manufacturing an acceleration sensor equipped with a base portion having an inner wall, a weight portion located inside the base portion and disposed away from the inner wall of the base portion, flexible beam portions placed over the upper portion of the base portion and the upper portion of the weight portion, and stopper portions which are fixed to the base portion and disposed over the weight portion and away from the weight portion and which restrict the amount of displacement of the weight portion in the vertical direction comprises a step for forming a mask on each of the stopper portions and a step for removing parts of the beam portions.

FIGS. 10 through 17 show a process for manufacturing the acceleration sensor of the present invention and illustrate a process in which a section taken along line A-A' of FIG. 1 is formed. FIGS. 18 through 21 show, in order, manufacturing process steps at the formation of a piezo resistive element on each beam portion in the manufacturing process of the acceleration sensor of the present invention and illustrate a process in which an enlarged portion having a section taken along line B-B' of FIG. 1 is formed.

Figure 10:
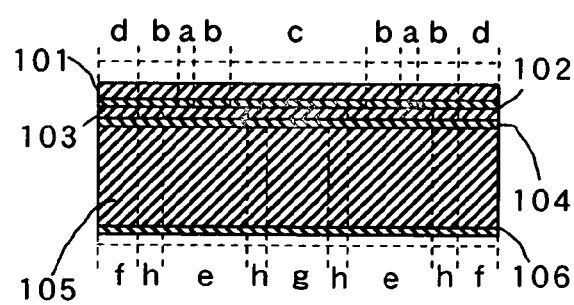
FIG. 10 is a view for describing a method of manufacturing the acceleration sensor according to the first embodiment of the present invention.

In the present embodiment, an SOI substrate obtained by stacking a first semiconductor layer 101 through a third insulator layer 106 on one another as shown in FIG. 10 is used. The SOI substrate has upper and lower surfaces. The upper surface of the SOI substrate includes a first area, a second area that surrounds the first area, a third area which makes contact with the second area, and a fourth area that surrounds the second and third areas. The lower surface of the SOI substrate has a fifth area, a sixth area which is spaced away from the fifth area and surrounds the fifth area and which is identical in shape to the fourth area of the upper surface of the SOI substrate and formed directly below the fourth area, a seventh area that connects the fifth area and the sixth area, and an eighth area adjacent to the fifth area, the sixth area and the seventh area. FIGS. 10 through 17 show the section taken along line A-A' of FIG. 1. A third area c located in the center thereof, second areas b adjacent to both sides of the third area c, first areas a adjacent to the outsides of the second areas b, second areas b adjacent to the outsides of the first areas a, and fourth areas d adjacent to the outsides of the second areas b are placed in the upper surface of the SOI substrate as viewed in the section taken along line A-A'. A seventh area g, eighth areas h adjacent to both sides of the seventh area g, fifth areas e adjacent to the eighth areas h, eighth areas h adjacent to the fifth areas e, and sixth areas f adjacent to the eighth areas h are located in the lower surface of the SOI substrate as viewed in the section taken along line A-A'. Here, the sixth areas f are identical in shape to the fourth areas d and formed directly below the fourth areas.

Figure 11:
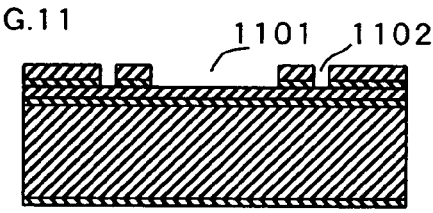
FIG. 11 is a view for describing the method of manufacturing the acceleration sensor according to the first embodiment of the present invention.

As shown in FIG. 11, etching openings 1102 are defined in the first semiconductor layer 101 and the first insulator layer 102 in the first area of the SOI substrate by using a Photolithographic Process and at the same time an opening 1101 is defined in the first semiconductor layer 101 and the first insulator layer 102 in the third area by use of the Photolithographic Process.

Next, the piezo resistive element is formed on each of the beam portions. However, the process step for forming the piezo resistive element will be explained later.

Figure 12:
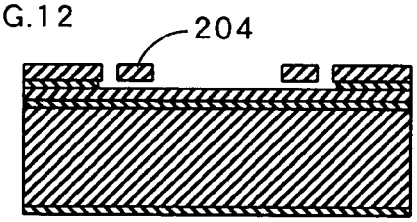
FIG. 12 is a view for describing the method of manufacturing the acceleration sensor according to the first embodiment of the present invention.

Next, as shown in FIG. 12, the entire area of the lower surface of the SOI substrate is coated with a resist on the reverse side thereof. Thereafter, the SOI substrate is immersed in buffer hydrofluoric acid. By the buffer hydrofluoric acid dyed from the opening 1101 and the etching openings 1102, the first insulator layer 102 of the second area is partially etched to form stopper portions 204. Thereafter, the resist provided on the lower surface of the SOI substrate is removed.

Figure 13:
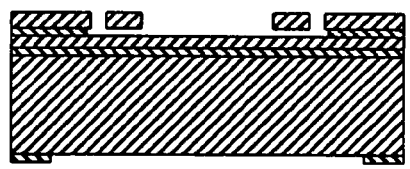
FIG. 13 is a view for describing the method of manufacturing the acceleration sensor according to the first embodiment of the present invention.

Next, as shown in FIG. 13, an opening pattern 1301 composed of an oxide film is defined in the fifth, seventh and eighth areas by the Photolithographic Process. Since, at this time, the amount of displacement of a weight portion downward is restricted to within the thickness of the third insulator layer 106, the thickness of the oxide film may be adjusted before the present process.

Figure 14:
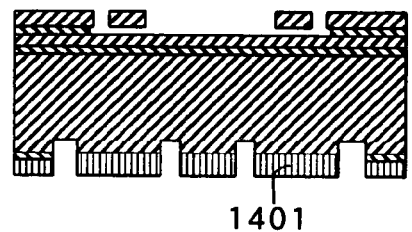
FIG. 14 is a view for describing the method of manufacturing the acceleration sensor according to the first embodiment of the present invention.

Next, as shown in FIG. 14, a photoresist 1401 is formed in the fifth, sixth and seventh areas of the lower surface of the SOI substrate. With the photoresist 1401 as an etching mask, some of the third semiconductor layer 105 in the eight areas are etched about 10 µm by using gas chopping etching. Thereafter, the photoresist 1401 formed in the lower surface of the SOI substrate is removed.

Figure 15:
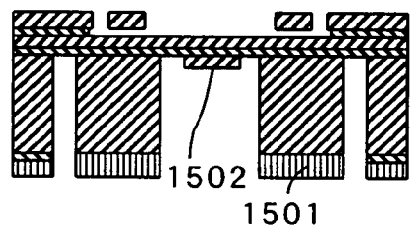
FIG. 15 is a view for describing the method of manufacturing the acceleration sensor according to the first embodiment of the present invention.

Next, as shown in FIG. 15, a photoresist 1501 is formed on the lower surfaces of the fifth and sixth areas of the SOI substrate. With the photoresist 1501 as an etching mask, the third semiconductor layer 105 in the seventh and eighth areas is etched using the gas chopping etching until the third semiconductor layer 105 in the eighth areas reaches the second insulator layer 102 to form openings. At this time, the third semiconductor layer 105 in the seventh area, which serves as a beam portion, is etched to form a beam protective portion 1502 having a thickness of about 5 µm in the third semiconductor layer 105 of the seventh area. The beam protective portion 1502 has the effect that layers for masking beam portions can be sequentially formed in the following process steps and the manufacturing process can be facilitated.

Figure 16:
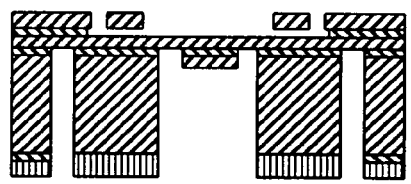
FIG. 16 is a view for describing the method of manufacturing the acceleration sensor according to the first embodiment of the present invention.

Next, as shown in FIG. 16, the second insulator layer 104 in the eight areas is etched under a dry etching condition with a selection ratio taken with respect to silicon with the photoresist 1501 and the beam protective portion 1502 as etching masks until it reaches the second semiconductor layer 103 to thereby form openings.

Figure 17:
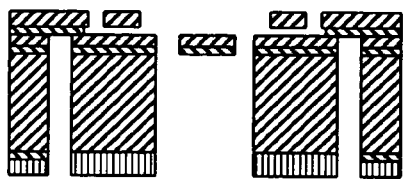
FIG. 17 is a view for describing the method of manufacturing the acceleration sensor according to the first embodiment of the present invention.

Next, as shown in FIG. 17, the third semiconductor layer 105 in the seventh area and the second semiconductor layer 103 in the eighth areas are removed by etching under a dry etching condition in which a selection ratio is taken with respect to an oxide film.

Next, the first insulator layer 102 in the eight areas and the second insulator layer 104 in the seventh area are etched under the dry etching condition with the selection ratio taken with respect to silicon and thereafter the photoresist 1501 is removed, thereby leading to completion of such an acceleration sensor having a stopper structure as shown in FIG. 2, according to the present embodiment.

The process of forming the piezo resistive element as means for electrically converting mechanical strain into an output on each beam portion will now be explained using the sectional view of the enlarged portion taken along line B-B' of FIG. 1, which is shown in FIGS. 18 to 21.

Figure 18:
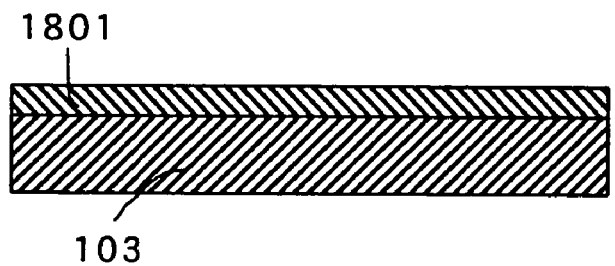
FIG. 18 is a view for describing a method of manufacturing a strain detecting element of the acceleration sensor according to the first embodiment of the present invention.

As shown in FIG. 18, an oxide film 1801 of 4000 Å is first formed on its corresponding second semiconductor layer 103 under a thermal oxidation condition using a humidification atmosphere of 1000° C.

Figure 19:
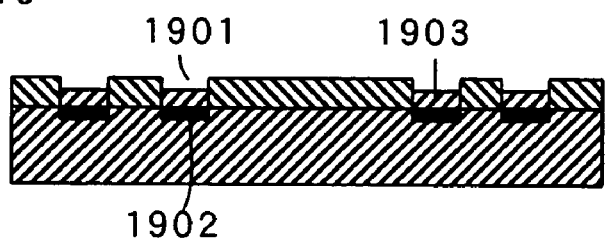
FIG. 19 is a view for describing the method of manufacturing the strain detecting element of the acceleration sensor according to the first embodiment of the present invention.

Next, as shown in FIG. 19, an opening 1901 is defined in the oxide film 1801 by a photolithographic process.

Next, a P type diffusion layer 1902 is formed below the opening 1901 and in the surface of the second semiconductor layer 103 by a boron diffusion layer.

Next, a protection oxide film 1903 is formed on the upper surface of the diffusion layer by a CVD method.

Figure 20:
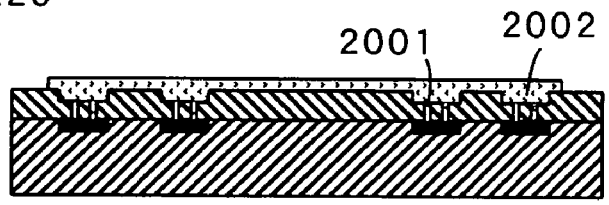
FIG. 20 is a view for describing the method of manufacturing the strain detecting element of the acceleration sensor according to the first embodiment of the present invention.

Next, as shown in FIG. 20, an electrode withdrawal or fetch opening 2001 extending from the upper surface of the protection oxide film 1903 to the diffusion layer 1902 is defined by the photolithographic process, and an aluminum wiring 2002 is formed by metal sputtering.

Figure 21:
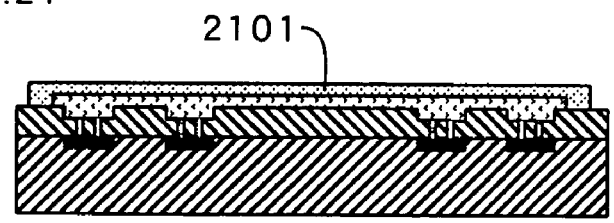
FIG. 21 is a view for describing the method of manufacturing the strain detecting element of the acceleration sensor according to the first embodiment of the present invention.

Next, as shown in FIG. 21, a silicon nitride film 2101 corresponding to a wiring protective film is formed by a PRD method. Then, the silicon nitride film 2101 is left behind so as to protect the aluminum wiring 2002 by the photolithographic process. According to the process steps shown in these FIGS. 18 through 21, the piezo resistive element is formed on each beam portion 205.

The method of manufacturing the acceleration sensor according to the first embodiment of the present invention has the effect that since the acceleration sensor having the stopper portions and non-formed with the stopper portions on the beam portions can be formed from one SOI wafer, the acceleration sensor excellent in impact resistance can be manufactured. Also the method has the effect that since the laminated SOI wafer is used in advance, position displacement due to the lamination does not occur and hence a high reliable acceleration sensor can be manufactured, and since the thickness of the first semiconductor layer and the thickness of the second semiconductor layer can be designed arbitrarily, the stopper portions and the beam portions can be changed in thickness respectively. Further, the method has the effect that since the process step for forming the beam protective portion is included therein, a mask process is simplified by virtue of the beam protective portion and hence a high reliable acceleration sensor can be fabricated.

Second Preferred Embodiment

Structure

A structure of an acceleration sensor according to a second embodiment of the present invention will be explained below using FIGS. 22 through 28.

Figure 22:
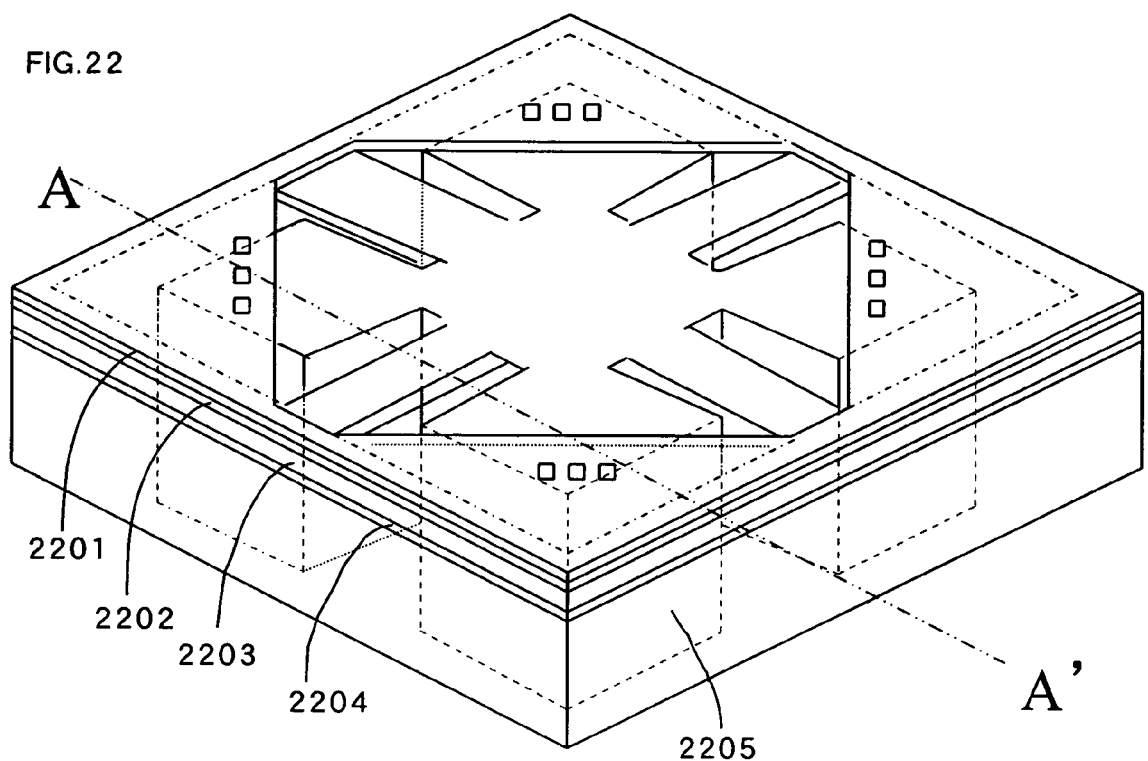
FIG. 22 is a perspective view showing an acceleration sensor according to a second embodiment of the present invention.
Figure 23:
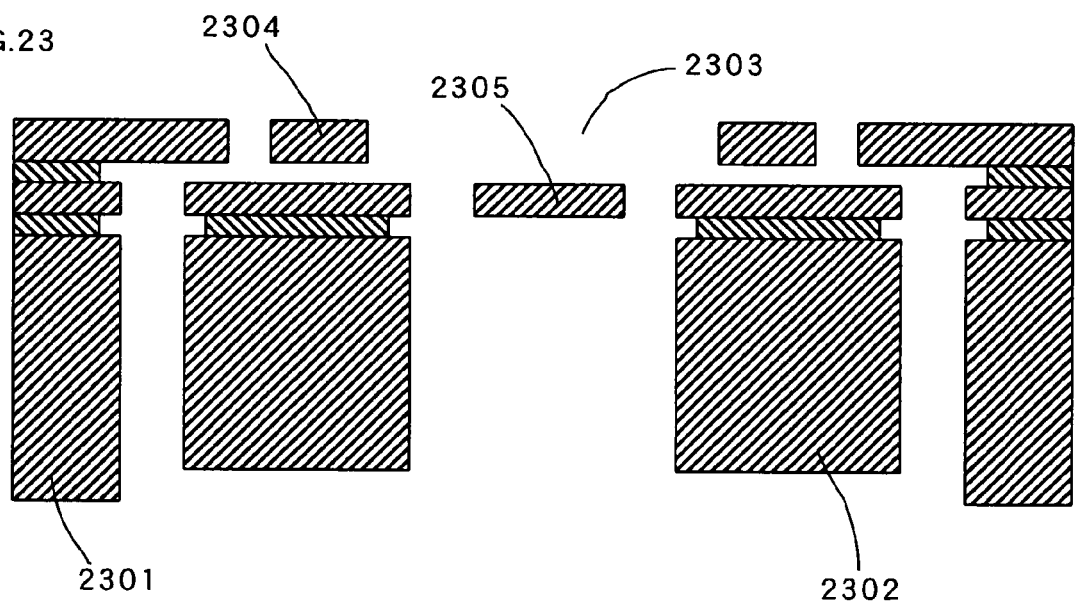
FIG. 23 is a view taken along line A-A' in FIG. 22.

FIG. 22 is a perspective view showing the acceleration sensor according to the second embodiment of the present invention. FIG. 23 is a cross-sectional view taken along line A-A', of the acceleration sensor of the present invention shown in FIG. 22.

As shown in FIG. 23, the acceleration sensor according to the second embodiment of the present invention comprises a base portion 2301, a weight portion 2302, an opening 2303, stopper portions 2304, and beam portions 2305. As to parts related to the present embodiment identical in structure to the first embodiment, the description of their detailed structures will be omitted here.

The weight portion 2302 is formed within the opening 2303 formed in a first area of the base portion 2301 and formed away from the inner wall of the base portion 2301. The weight portion 2302 is of a laminated substrate having square upper and lower surfaces and side surfaces. A concave portion extending from the upper and lower surfaces is formed in the central part of each side surface of the weight portion 2302.

The acceleration sensor according to the second embodiment of the present invention takes an SOI structure.

As shown in FIG. 22, the acceleration sensor according to the second embodiment of the present invention has an SOI structure obtained by laminating a first semiconductor layer 2201, a first insulator layer 2202, a second semiconductor layer 2203, a second insulator layer 2204, and a third semiconductor layer 2205 on one another. Since the first semiconductor layer 2201, the first insulator layer 2202, the second semiconductor layer 2203, and the second insulator layer 2204 are similar in structure to the first embodiment, the description thereof is omitted here. The third semiconductor layer 2205 is of the bottom or lowermost layer and is constituted of a silicon layer having a thickness of 500 μm, for example.

The acceleration sensor according to the second embodiment of the present invention will be explained every layers.

Since the first semiconductor layer 2201, the first insulator layer 2202, the second semiconductor layer 2203, the second insulator layer 2204, the third semiconductor layer 2205 and a third insulator layer 2901 have areas similar to those employed in the first embodiment, the detained description of the respective areas is omitted.

Since FIGS. 24 through 27 show structures similar to the first embodiment, the description thereof is omitted here.

FIG. 28 is a top view showing the third semiconductor layer 2205 of the acceleration sensor of the present invention. As shown in FIG. 28, the third semiconductor layer 2205 is rectangular in shape and has a first area, a second area that surrounds the first area, and a third area that surrounds the second area. Here, the first area of the third semiconductor layer 2205 corresponds to the first area of the second insulator layer 2204. The second area of the third semiconductor layer 2205 corresponds to the second area of the second insulator layer 2204. The third area of the third semiconductor layer 2205 corresponds to the third area of the second insulator layer 2204. The third semiconductor layer 2205 comprises a frame portion 2801 formed in the third area, a weight portion 2802 formed in the first area, and hole portions 2803 each formed in the second area. The frame portion 2801 is shaped in the form of a frame having a predetermined thickness in the center direction from its outer edge portions. Here, the frame portion 2801 corresponds to one of the plural layers that constitute the base portion 2301 and is placed directly below the frame portion 2701. The weight portion 2802 has shapes having concave portions defined in the central parts of the respective square sides. Here, the weight portion 2802 corresponds to one of plural layers constituting the weight portion 2302 and is of the lowermost layer of the weight portion 2302. The lower surface of the weight portion 2802 is located on the upper side than the lower surface of the frame portion 2801. The weight portion 2802 is located directly below the weight portion 2702. The hole portions 2803 are defined along the outer sides of the weight portion 2802 and are respectively spaces surrounded by the frame portion 2801 and the weight portion 2802. Here, the hole portions 2803 are placed below the hole portions 2703 respectively.

The base portion 2301 of the acceleration sensor according to the second embodiment of the present invention comprises a frame portion 2401 of the first semiconductor layer 2201, a frame portion 2501 of the first insulator layer 2202, a frame portion 2601 of the second semiconductor layer 2203, a frame portion 2701 of the second insulator layer 2204, and the frame portion 2801 of the third semiconductor layer 2205. The base portion 2301 constitutes the side surfaces of the acceleration sensor of the present invention. The weight portion 2302 comprises a weight portion 2602 of the second semiconductor layer 2203, a weight portion 2702 of the second insulator layer 2204 and the weight portion 2802 of the third semiconductor layer 2205 and is disposed inside the base portion 2301. The weight portion 2302 is a rectangular parallelepiped having upper, lower and side surfaces. The upper surface thereof is connected to the beam portions 2305, and the side surfaces thereof are formed with concave portions defined in the central parts from the upper surface to the lower surface. The lower surface of the weight portion 2302 is located on the upper side than the lower surface of the base portion 2301. The opening 2303 with the stopper portions 2304 and the beam portions 2305 formed therein is formed by the hole portion 2403 corresponding to a component of the first semiconductor layer 2201, a hole portion 2502 corresponding to a component of the first insulator layer 2202, and hole portions 2605 corresponding to components of the second semiconductor layer 2203. The opening 2303 is a space surrounded by the base portion 2301, the weight portion 2302, the stopper portions 2304 and the beam portions 2305. Each of the stopper portions 2304 formed by the opening 2303 is formed in the first semiconductor layer 2201 and shaped in triangular form so as to cover the corners of the frame-shaped base portion 2301. Each of the beam portions 2305 formed by the opening 2303 is formed in the second semiconductor layer 2203 and shaped in rectangular form so as to connect the base portion 2301 and the weight portion 2302.

The acceleration sensor according to the second embodiment of the present invention has the effect that since the number of the layers for forming the SOI wafer is less reduced as compared with the first embodiment, a thin type acceleration sensor can be formed, in addition to the effect obtained in the first embodiment.

Manufacturing Method

A method of manufacturing the acceleration sensor according to the second embodiment of the present invention will be explained below using FIG. 22 and FIGS. 29 through 36.

A method of manufacturing the acceleration sensor using the laminated substrate shown in FIG. 22, i.e., a method of manufacturing an acceleration sensor equipped with a base portion having an inner wall, a weight portion located inside the base portion and disposed away from the inner wall of the base portion, flexible beam portions placed over the upper portion of the base portion and the upper portion of the weight portion, and stopper portions which are fixed to the base portion and disposed over the weight portion and away from the weight portion and which restrict the amount of displacement of the weight portion in the vertical direction, comprises a step for forming a mask on each of the stopper portions, a step for removing parts of the beam portions, a step for forming a mask on the lower surface of the base portion, and a step for removing part of the weight portion.

FIGS. 29 through 36 show a process for manufacturing the acceleration sensor of the present invention and illustrate a process in which a section taken along line A-A' of FIG. 22 is formed.

Figure 29:
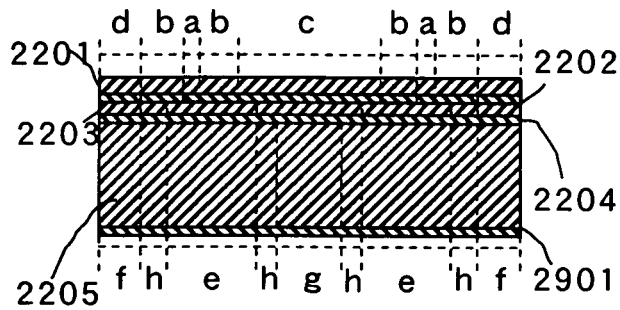
FIG. 29 is a view for describing a method of manufacturing the acceleration sensor according to the second embodiment of the present invention.

In the present embodiment, an SOI substrate obtained by stacking a first semiconductor layer 2201 through a third semiconductor layer 2206 and a third insulator layer 2901 on one another as shown in FIG. 29 is used. The third insulator layer 2901 is formed directly below the third semiconductor layer 2206 and is composed of a silicon oxide film having a thickness of 2 µm, for example. The SOI substrate has upper and lower surfaces. The upper surface of the SOI substrate includes a first area, a second area that surrounds the first area, a third area which makes contact with the second area, and a fourth area that surrounds the second and third areas. The lower surface of the SOI substrate has a fifth area, a sixth area which is spaced away from the fifth area and surrounds the fifth area and which is identical in shape to the fourth area of the upper surface of the SOI substrate and formed directly below the fourth area, a seventh area that connects the fifth area and the sixth area, and an eighth area adjacent to the fifth area, the sixth area and the seventh area. FIGS. 29 through 36 show the section taken along line A-A' of FIG. 22. A third area c located in the center thereof, second areas b adjacent to both sides of the third area c, first areas a adjacent to the outsides of the second areas b, second areas b adjacent to the outsides of the first areas a, and fourth areas d adjacent to the outsides of the second areas b are placed in the upper surface of the SOI substrate as viewed in the section taken along line A-A'. A seventh area g, eighth areas h adjacent to both sides of the seventh area g, fifth areas e adjacent to the eighth areas h, eighth areas h adjacent to the fifth areas e, and sixth areas f adjacent to the eighth areas h are located in the lower surface of the SOI substrate as viewed in the section taken along line A-A'. Here, the sixth areas f are identical in shape to the fourth areas d and formed directly below the fourth areas d. As to parts related to the present embodiment, which are identical in manufacturing method to the first embodiment, the description of their detailed manufacturing method will be omitted here.

Since the manufacturing method shown in FIGS. 29 through 32 is similar to the first embodiment in the present embodiment, the description of its detailed manufacturing method is omitted here.

Figure 33:
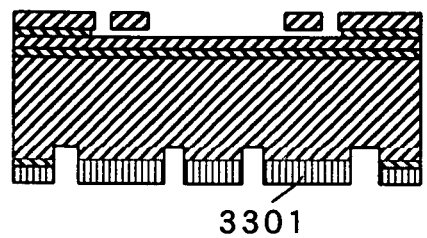
FIG. 33 is a view for describing the method of manufacturing the acceleration sensor according to the second embodiment of the present invention.
Figure 30:
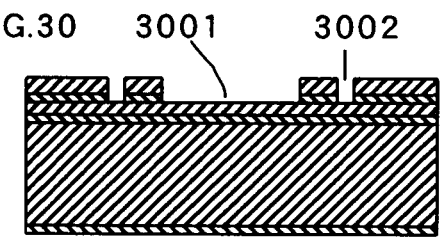
FIG. 30 is a view for describing the method of manufacturing the acceleration sensor according to the second embodiment of the present invention.

As shown in FIG. 33, a photoresist 3301 is formed in the fifth, sixth and seventh areas of the lower surface of the SOI substrate. With the photoresist 3301 as an etching mask, some of the third semiconductor layer 2205 in the eight areas are etched about 10 µm by using gas chopping etching. Thereafter, the photoresist 3301 formed in the lower surface of the SOI substrate is removed.

Figure 34:
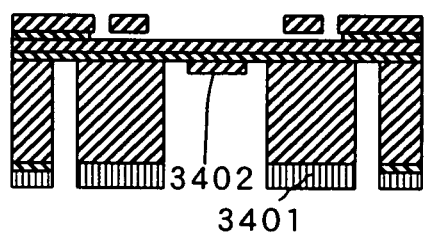
FIG. 34 is a view for describing the method of manufacturing the acceleration sensor according to the second embodiment of the present invention.
Figure 31:
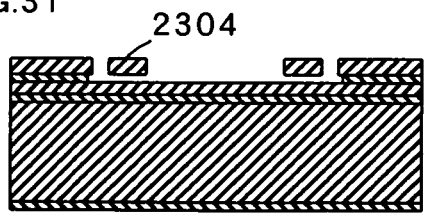
FIG. 31 is a view for describing the method of manufacturing the acceleration sensor according to the second embodiment of the present invention.

Next, as shown in FIG. 34, a photoresist 3401 is formed on the lower surfaces of the fifth and sixth areas of the SOI substrate. With the photoresist 3401 as an etching mask, the third semiconductor layer 2205 in the seventh and eighth areas is etched using the gas chopping etching until the third semiconductor layer 2205 in the eighth areas reaches the second insulator layer 2202, thereby to form openings. At this time, the third semiconductor layer 2205 in the seventh area, which serves as a beam portion, is etched to form a beam protective portion 3402 having a thickness of about 5 µm in the third semiconductor layer 2205 of the seventh area. The beam protective portion 3402 has the effect that layers for masking beam portions can be sequentially formed in the following process steps and the manufacturing process can be facilitated.

Figure 35:
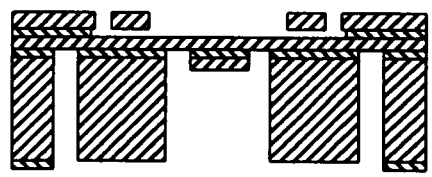
FIG. 35 is a view for describing the method of manufacturing the acceleration sensor according to the second embodiment of the present invention.
Figure 32:
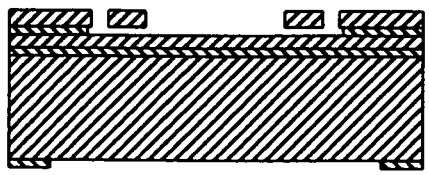
FIG. 32 is a view for describing the method of manufacturing the acceleration sensor according to the second embodiment of the present invention.

Next, as shown in FIG. 35, fourth hole portions are defined in the second insulator layer 2204 by performing the gas chopping etching with the third insulator layer 2901 in the sixth area and the third semiconductor layer 2205 in the fifth and seventh areas as etching masks.

Figure 36:
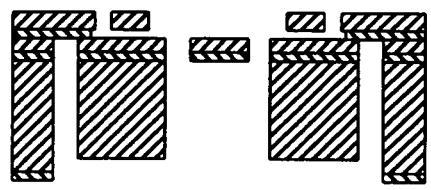
FIG. 36 is a view for describing the method of manufacturing the acceleration sensor according to the second embodiment of the present invention.

Next, as shown in FIG. 36, the third semiconductor layer 2205 in the fifth and seventh areas and the second semiconductor layer 2203 in the eighth areas are etched until the beam protective portion 3402 is removed, thereby to form a fifth hole portion.

Next, the substrate is immersed in buffer hydrofluoric acid and a first insulator layer 2902 in the eight areas, a second insulator layer in the seventh area, and a third insulator layer 2906 in the sixth areas are etched to form sixth hole portions, thereby leading to completion of such an acceleration sensor having a stopper structure as shown in FIG. 23, according to the present embodiment.

The method of manufacturing the acceleration sensor according to the second embodiment of the present invention has an effect similar to the above embodiment and includes the effect that the fifth layer in the eight area is etched in two stages to form the lower surface of the weight portion in the fifth layer and above the lower surface of the base portion, whereby an acceleration sensor of such a type that it is thinner than the first embodiment can be manufactured.

Third Preferred Embodiment

Structure

A structure of an acceleration sensor according to a third embodiment of the present invention will be explained below using FIGS. 37 through 41.

Figure 37:
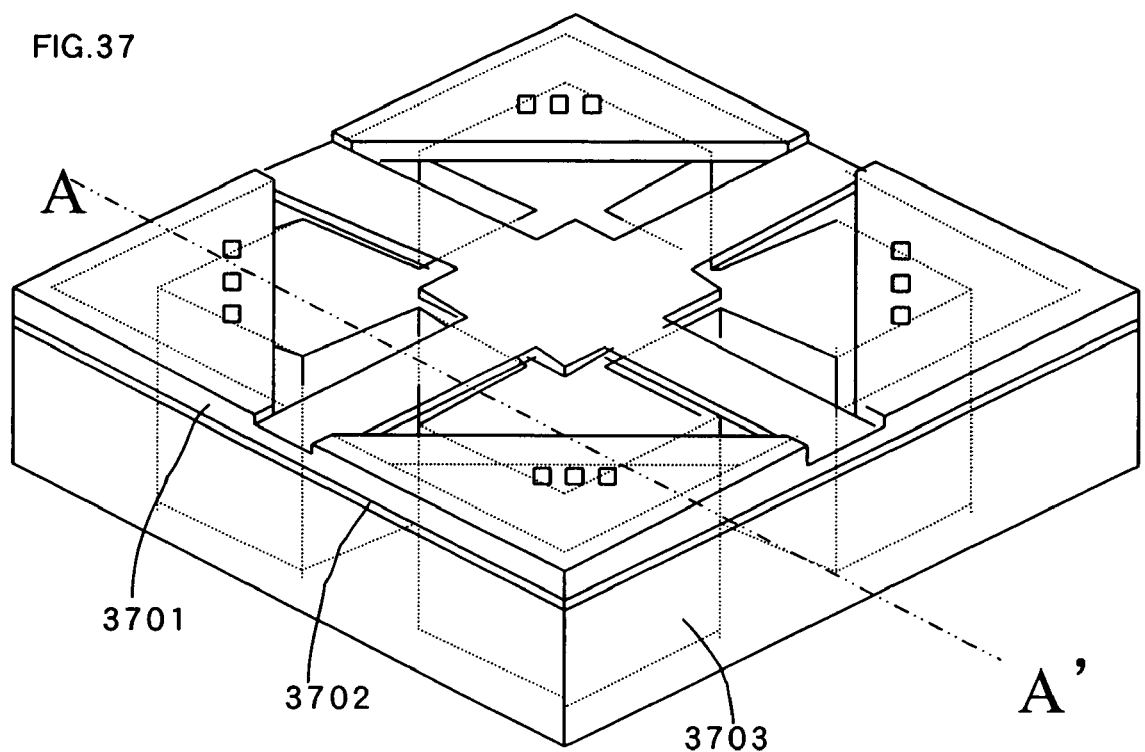
FIG. 37 is a perspective view showing an acceleration sensor according to a third embodiment of the present invention.
Figure 38:
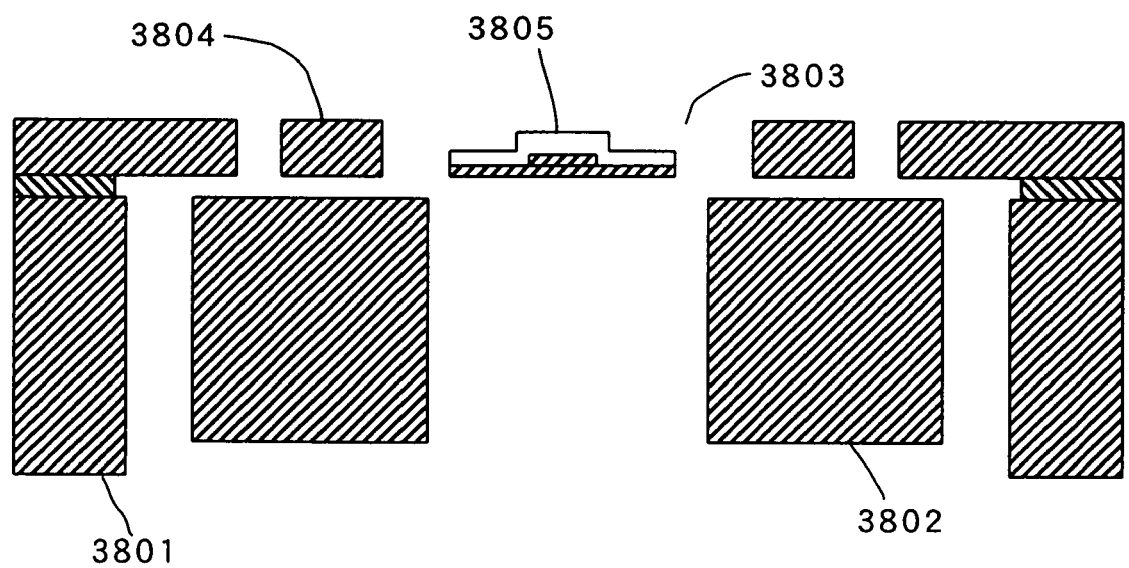
FIG. 38 is a cross-sectional view taken along line A-A' in FIG. 37.

FIG. 37 is a perspective view showing the acceleration sensor according to the third embodiment of the present invention. FIG. 38 is a cross-sectional view taken along line A-A', of the acceleration sensor of the present invention, which is shown in FIG. 37.

As shown in FIG. 38, the acceleration sensor according to the third embodiment of the present invention comprises a base portion 3801, a weight portion 3802, an opening 3803, stopper portions 3804 and beam portions 3805. As to parts related to the present embodiment identical in structure to the first embodiment, the description of their detailed structures will be omitted here.

The stopper portions 3804 are fixed to the base portion and formed over the weight portion 3802 away from the weight portion 3802. Since the shape of each stopper portion is similar to the first and second embodiments, the description thereof is omitted here.

Since the acceleration sensor according to the third embodiment of the present invention is of an SOI structure below, the SOI structure will first be explained.

As shown in FIG. 37, the acceleration sensor according to the third embodiment of the present invention has an SOI structure obtained by laminating a first semiconductor layer 3701, a first insulator layer 3702, and a second semiconductor layer 3703 on one another. Since the first semiconductor layer 3701 and the first insulator layer 3702 are similar to the first embodiment, the description thereof is omitted here. The second semiconductor layer 3703 is of the bottom or lowermost layer and is composed of a silicon layer having a thickness of 500 μm, for example. The first insulator layer 3702 is disposed directly above the second semiconductor layer 3703 and made up of a silicon oxide film having a thickness of 4 μm, for example. The first semiconductor layer 3701 corresponds to the top layer, and is disposed directly above the first insulator layer 3702 and composed of a silicon layer having a thickness of 15 μm, for example.

The acceleration sensor according to the third embodiment of the present invention will next be described every layers.

FIG. 39 is a top view showing the first semiconductor layer 3701 of the acceleration sensor of the present invention. As shown in FIG. 39, the first semiconductor layer 3701 is rectangular in shape and has a first area, a second area which is spaced away from the first area and surrounds the first area, a third area that connects the first and second areas, a fourth area disposed between the first area and the second area, a fifth area which surrounds the fourth area and is connected to the second area, and a sixth area surrounded by the first area, the second area, the third area and the fifth area. The first semiconductor layer 3701 comprises a frame portion 3901 formed in the second area, stopper portions 3902 formed in the fifth area, a weight portion 3903 formed in the first area, beam portions 3904 disposed in the third area, hole portions 3905 formed in the sixth area, and etching openings 3906 disposed in the fourth area. The frame portion 3901 is shaped in the form of a frame having a predetermined thickness in the center direction from its outer edge sides. Here, the frame portion 3901 is one of plural layers constituting the base portion 3801 and corresponds to the uppermost layer of the base portion 3901. The stopper portions 3902 have triangular shapes having two sides which are connected to their corresponding insides of the frame portion 3901 and extend out from the corners of the inner wall of the frame portion 3901 to the center. The weight portion 3903 is rectangular in shape and placed in the center of the first semiconductor layer 3701. That is, the center of the weight portion 3903 is located with distances substantially equal from the respective sides located at the outer edge portions of the first semiconductor layer 3701. Here, the weight portion 3903 is one of plural layers constituting the weight portion 3802 and corresponds to its uppermost layer. The beam portions 3904 are rectangular in shape and connect the frame portion 3901 and the weight portion 3902. Here, the thickness of each beam portion from its lower surface to its upper surface is configured with a thickness thinner than the thickness of each stopper portion from its lower surface to its upper surface. The hole portions 3905 are respectively spaces surrounded by the frame portion 3901, the stopper portions 3902, the weight portion 3903 and the beam portions 3904. Here, the hole portions 3905 are parts of the opening 3803. The etching openings 3906 are a plurality of small through holes defined to allow etchant to pass therethrough and etch the layers below the stopper portions.

FIG. 40 is a top view showing the first insulator layer 3702 of the acceleration sensor of the present invention. As shown in FIG. 40, the first insulator layer 3702 is rectangular in shape and has a seventh area, an eighth area that surrounds the seventh area, and a ninth area that surrounds the eighth area. Here, the ninth area is identical in shape to the second area of the first semiconductor layer 3701 and disposed directly below the second area. The first insulator layer 3702 comprises a frame portion 4001 formed in the ninth area, a weight portion 4002 formed in the seventh area, and a hole portion or opening 4003 formed in the eighth area. The frame portion 4001 is shaped in the form of a frame having a predetermined thickness in the center direction from its outer edge portions. Here, the frame portion 4001 corresponds to one of the plural layers constituting the base portion 3801 and is placed directly below the frame portion 3901. The weight portion 4002 is rectangular in shape. The weight portion 4002 is located in the center of the first insulator layer 3702. That is, the center of the weight portion 4002 is located with distances substantially equal from the respective sides located at the outer edge portions of the first semiconductor layer 3702. Here, the weight portion 4002 is part of a layer constituting the weight portion 3802 and is placed below the weight portion 3903. The hole portion 4003 is formed along the outer sides of the weight portion 4002 and is a space surrounded by the frame portion 4001 and the weight portion 4002. Here, the hole portion 4003 is part of the opening 3803 and is located below each hole portion 3905.

FIG. 41 is a top view showing the second semiconductor layer 3703 of the acceleration sensor of the present invention. As shown in FIG. 41, the second semiconductor layer 3703 is rectangular in shape and has a seventh area, an eighth area that surrounds the seventh area, and a ninth area that surrounds the eighth area. Here, the ninth area is identical in shape to the ninth area of the first insulator layer 3702 and disposed directly therebelow. The second semiconductor layer 3703 comprises a frame portion 4101 formed in the ninth area, a weight portion 4102 formed in the seventh area, and hole portions 4103 formed in the eighth area. The frame portion 4101 is shaped in the form of a frame having a predetermined thickness in the center direction from its outer edge portions. Here, the frame portion 4101 corresponds to one of the plural layers constituting the base portion 3801 and is placed directly below the frame portion 4001. The weight portion 4102 has shapes having concave portions defined in the central parts of their square sides, which are symmetrical with each other from side to side. Here, the weight portion 4102 is one of the plural layers constituting the weight portion 3802 and corresponds to the uppermost layer of the weight portion 3802 the lower surface of the weight portion 4102 is located on the upper side than the lower surface of the frame portion 4101. The weight portion 4102 is located directly below the weight portion 4002. The hole portions 4103 are formed along the outer sides of the weight portion 4102 and respectively spaces surrounded by the frame portion 4101 and the weight portion 4102. Here, the hole portions 4103 are placed directly below the hole portion 4003.

The base portion 3801 of the acceleration sensor according to the third embodiment of the present invention comprises the frame portion 3901 of the first semiconductor layer 3701, the frame portion 4001 of the first insulator layer 3702, and the frame portion 4101 of the second semiconductor layer 3703. The base portion 3801 constitutes the side surfaces of the acceleration sensor of the present invention. The weight portion 3802 comprises the weight portion 3903 of the first semiconductor layer 3701, the weight portion 4002 of the first insulator layer 3702 and the weight portion 4103 of the second semiconductor layer 3703 and is disposed inside the base portion 2301. The weight portion 3803 is a rectangular parallelepiped having upper, lower and side surfaces. The upper surface thereof is connected to the beam portions 3805, and the side surfaces thereof are formed with concave portions defined in the central parts from the upper surface to the lower surface. The lower surface of the weight portion 3803 is located on the upper side than the lower surface of the base portion 3801. The opening 3803 with the stopper portions 3804 and the beam portions 3805 formed therein is formed by the hole portions 3905 corresponding to components of the first semiconductor layer 3701 and the hole portion 4003 corresponding to a component of the first insulator layer 3702. The opening 3803 is a space surrounded by the base portion 3801, the weight portion 3802, the stopper portions 3804 and the beam portions 3805. Each of the stopper portions 3804 formed by the opening 3803 is formed in the first semiconductor layer 3701 and shaped in triangular form so as to cover the corners of the base portion 3801 shaped in frame form. Each of the beam portions 3805 formed by the opening 3803 is formed in the first semiconductor layer 3701 and shaped in rectangular form so as to connect the base portion 3801 and the weight portion 3802. Here, the thickness of each beam portion from its lower surface to its upper surface is configured with a thickness thinner than the thickness of each stopper portion from its lower surface to its upper surface.

The acceleration sensor according to the third embodiment of the present invention has the effect that since the laminated number of SOI wafers is small, it can be brought into less thickness, in addition to the effects of the first and second embodiments. The acceleration sensor has the effect that since the beam portions are thinner than the stopper portions and the two exist in the same layer, the thickness of each stopper portion and the thickness of each beam portion can be designed respectively, thereby making it possible to enhance the sensitivity of the acceleration sensor and form an acceleration sensor excellent in impact resistance. The acceleration sensor has the effect that since no stopper portions are disposed above the beam portions, the breakage of the beam portions due to the collision of the beam portions with the stopper portions when the beam portions are displaced in the vertical direction, does not occur and hence reliability is enhanced.

Manufacturing Method

A method of manufacturing the acceleration sensor according to the third embodiment of the present invention will be explained below using FIG. 37 and FIGS. 42 through 47.

A method of manufacturing the acceleration sensor using the laminated substrate shown in FIG. 37, i.e., a method of manufacturing an acceleration sensor equipped with a base portion having an inner wall, a weight portion located inside the base portion and disposed away from the inner wall of the base portion, flexible beam portions placed over the upper portion of the base portion and the upper portion of the weight portion, and stopper portions which are fixed to the base portion and disposed over the weight portion and away from the weight portion and which restrict the amount of displacement of the weight portion in the vertical direction, comprises a step for forming a mask on each of the stopper portions, a step for removing parts of the beam portions, a step for forming a mask on the lower surface of the base portion, and a step for removing part of the weight portion.

FIGS. 42 through 47 show a process for manufacturing the acceleration sensor of the present invention and illustrate a process in which a section taken along line A-A' of FIG. 37 is formed.

Figure 42:
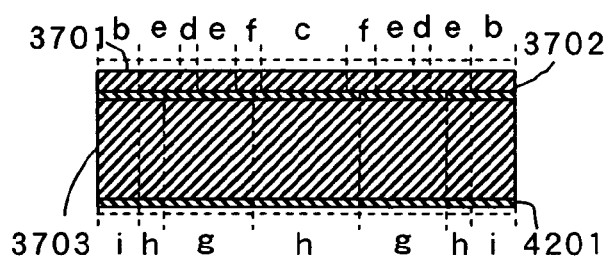
FIG. 42 is a view for describing a method of manufacturing the acceleration sensor according to the third embodiment of the present invention.

In the present embodiment, an SOI substrate obtained by stacking a first semiconductor layer 3701 through a second semiconductor layer 3703 and a second insulator layer 4201 on one another as shown in FIG. 42 is used. The second insulator layer 4201 is formed directly below the second semiconductor layer 3703 and is composed of a silicon oxide film having a thickness of 2 μm, for example. The SOI substrate has upper and lower surfaces. The upper surface of the SOI substrate includes a first area, a second area that surrounds the first area away from the first area, a third area that connects the first area and the second area, a fourth area disposed between the first area and the second area, a fifth area which surrounds the fourth area and makes contact with the second area, and a sixth area surrounded by the first area, the second area, the third area and the fifth area. The lower surface of the SOI substrate has a seventh area, an eighth area that surrounds the seventh area, and a ninth area which is identical in shape to the second area of the upper surface of the SOI substrate and formed directly below the second area. FIGS. 42 through 47 show the section taken along line A-A' of FIG. 37. A third area c located in the center thereof, sixth areas f adjacent to both sides of the third area c, fifth areas e adjacent to the outsides of the sixth areas f, fourth areas d adjacent to the outsides of the fifth areas e, fifth areas e adjacent to the outsides of the fourth areas d, and second areas b adjacent to the outsides of the fifth areas e are placed in the upper surface of the SOI substrate as viewed in the section taken along line A-A'. An eighth area h, seventh areas g adjacent to both sides of the eighth area h, eighth areas h adjacent to the seventh areas g, and ninth areas i adjacent to the eighth areas h are located in the lower surface of the SOI substrate as viewed in the section taken along line A-A'. Here, the ninth areas i are identical in shape to the second areas b and formed directly below the second areas b.

Figure 43:
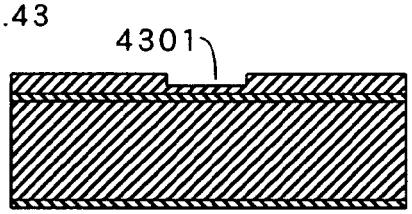
FIG. 43 is a view for describing the method of manufacturing the acceleration sensor according to the third embodiment of the present invention.

Next, as shown in FIG. 43, the first semiconductor layer 3701 in the third area of the SOI substrate is subjected to a Photolithographic Process so as to leave the thickness of each beam portion 3805 as it is to thereby form a trench 4301 corresponding to a first trench.

Next, a piezo resistive element is formed on each beam portion. Since a process step for forming the piezo resistive element on the beam portion is similar to the first embodiment, the description thereof is omitted here.

Figure 44:
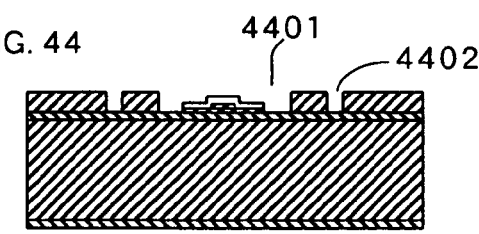
FIG. 44 is a view for describing the method of manufacturing the acceleration sensor according to the third embodiment of the present invention.

Next, as shown in FIG. 44, first hole portions are defined in the first semiconductor layer 3701 of the fourth area by the Photolithographic Process to form etching openings 4402. At the same time, a second hole portion is defined in the first semiconductor layer 3701 of the sixth area by the Photolithographic Process to form an opening 4401.

Figure 45:
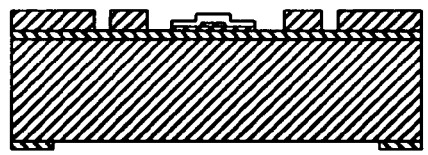
FIG. 45 is a view for describing the method of manufacturing the acceleration sensor according to the third embodiment of the present invention.

Next, as shown in FIG. 45, an opening pattern made up of an oxide film is formed in the second insulator layer 4201 in the seventh and eighth areas by the Photolithographic Process.

Figure 46:
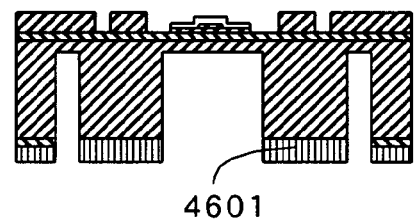
FIG. 46 is a view for describing the method of manufacturing the acceleration sensor according to the third embodiment of the present invention.

Next, as shown in FIG. 46, a photoresist 4601 is formed, and the reverse side of the second semiconductor layer 3703 in the eighth area is etched about 480 µm by using gas chopping etching with the photoresist 4601 as an etching mask to form a third hole portion and thereby remove the photoresist 4601. Here, such 480 µm-etching is done to set the difference between the distance from the lower surface of the frame portion 4101 formed in the third semiconductor layer 3703 to its upper surface and the distance from the lower surface of the weight portion 4102 formed in the third semiconductor layer to its upper surface to 20 µm. That is, the amount of etching of a second semiconductor layer 4203 in the present process may be carried out in view of design for the difference in distance.

Figure 47:
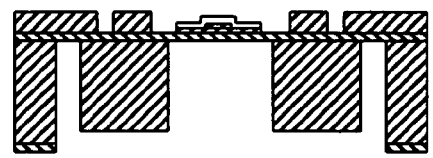
FIG. 47 is a view for describing the method of manufacturing the acceleration sensor according to the third embodiment of the present invention.

Next, as shown in FIG. 47, the reverse side of the second semiconductor layer 3703 in the seventh and eighth areas is etched using the gas chopping etching with the second insulator layer as an etching mask until it reaches the first insulator layer 3702.

Next, the substrate is immersed in buffer hydrofluoric acid and the first insulator layer 3702 in the third, fourth, fifth and sixth areas is partially etched and removed, thereby leading to completion of such an acceleration sensor having a stopper structure as shown in FIG. 38, according to the present embodiment.

In addition to the effects of the first and second embodiments, the method of manufacturing the acceleration sensor according to the third embodiment of the present invention has the effect that since the first layer in the third area is etched to remove parts of the beam portions and hence the thickness of each beam portion can be designed freely, the thickness of each stopper portion and the thickness of each beam portion can be changed respectively, thereby making it possible to enhance the sensitivity of the acceleration sensor while impact resistance is being improved.

Fourth Preferred Embodiment

Structure

A structure of an acceleration sensor according to the fourth embodiment of the present invention will be explained below using FIGS. 48 through 63.

Figure 48:
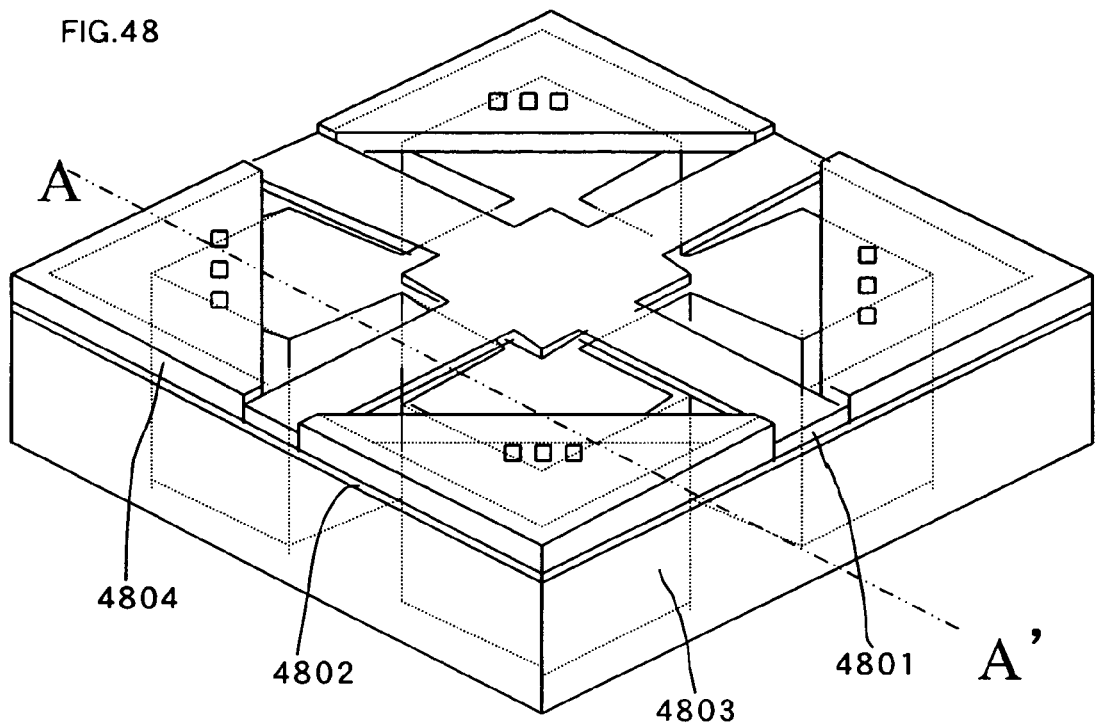
FIG. 48 is a perspective view showing an acceleration sensor according to a fourth embodiment of the present invention.
Figure 49:
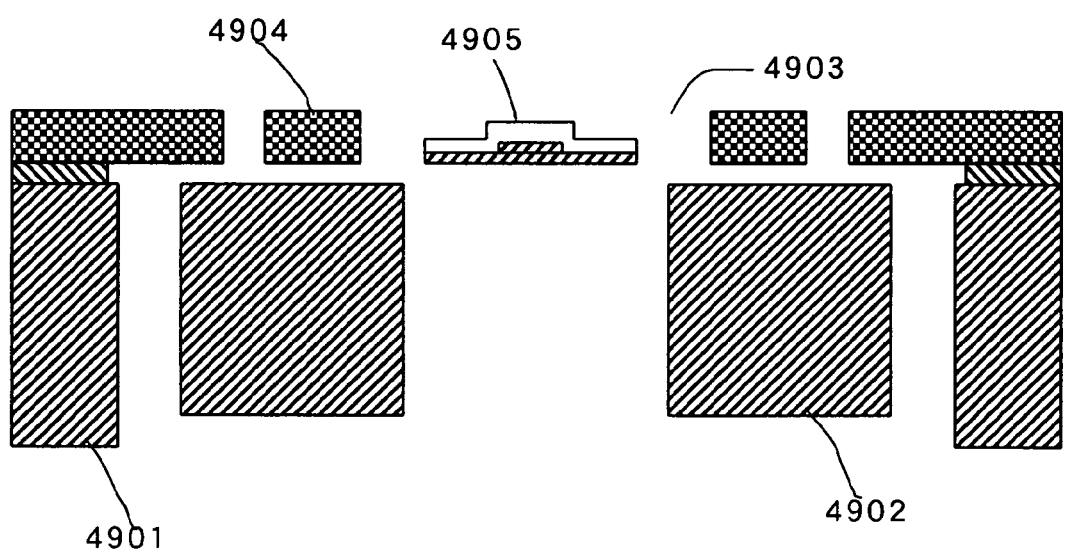
FIG. 49 is a cross-sectional view taken along line A-A' in FIG. 48.

FIG. 48 is a perspective view showing the acceleration sensor according to the fourth embodiment of the present invention. FIG. 49 is a cross-sectional view taken along line A-A', of the acceleration sensor of the present invention, which is shown in FIG. 48.

As shown in FIG. 49, the acceleration sensor according to the fourth embodiment of the present invention comprises a base portion 4901, a weight portion 4902, an opening 4903, stopper portions 4904 and beam portions 4905. As to parts related to the present embodiment identical in structure to the third embodiment, the description of their detailed structures will be omitted here.

The stopper portions 4904 are fixed to the base portion 4901. The stopper portions 4904 are formed over the upper surface of the weight portion 4902 away from the weight portion 4902 and formed of a metal. Since the shape of each stopper portion is similar to the first embodiment, it is omitted here.

Since the acceleration sensor according to the fourth embodiment of the present invention is of an SOI structure, the SOI structure will first be explained.

As shown in FIG. 48, the acceleration sensor according to the fourth embodiment of the present invention is of an SOI structure obtained by laminating a first semiconductor layer 4801, a first insulator layer 4802, a second semiconductor layer 4803 and a metal layer 4804 on one another. A first layer 4805 comprising the first semiconductor layer 4801 and the metal layer 4804 is disposed directly above the first insulator layer. Since the first insulator layer 4802 and the second semiconductor layer 4803 are similar in shape to the third embodiment, the description thereof is omitted here. The first layer 4805 corresponds to the top layer and is disposed directly above the first insulator layer 4802. The first semiconductor layer 4801 constituting the first layer 4805 comprises a silicon layer having a thickness of 15 µm, for example. The metal layer 4804 constituting the first layer 4805 is disposed directly above the first insulator layer and comprises copper having a thickness of 15 µm, for example.

The acceleration sensor according to the fourth embodiment of the present invention will next be described every layers.

Since the first insulator layer 4802 and the second semiconductor layer 4803 have areas similar to the third embodiment, the detailed description of the respective areas is omitted.

Figure 50:
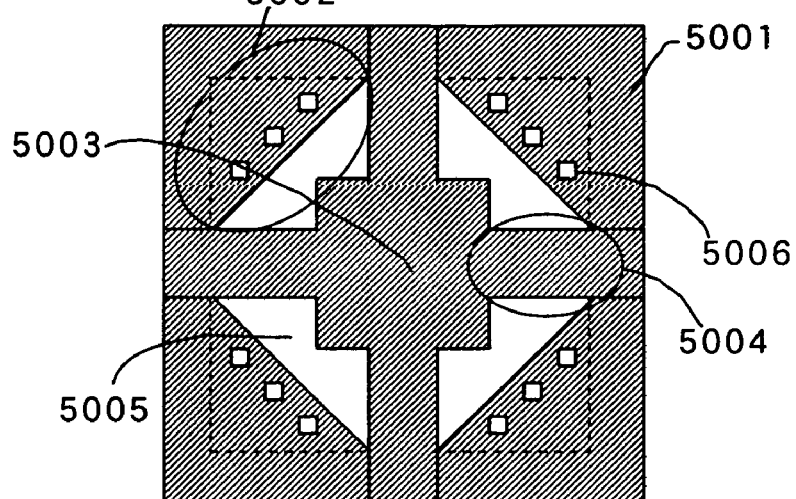
FIG. 50 is a top view showing a first layer of the acceleration sensor according to the fourth embodiment of the present invention.

FIG. 50 is a top view showing the first layer 4805 of the acceleration sensor of the present invention. The first layer 4805 comprises the first semiconductor layer 4801 and the metal layer 4804. As shown in FIG. 50, the first layer is rectangular in shape and has a first area, a second area which is spaced away from the first area and surrounds the first area, a third area that connects the first and second areas, a fourth area disposed between the first area and the second area, a fifth area which surrounds the fourth area and makes contact with the second area, and a sixth area surrounded by the first area, the second area, the third area and the fifth area. The first layer 4805 comprises a frame portion 5001 formed in the second area, stopper portions 5002 formed of a metal in the fifth area, a weight portion 5003 formed in the first area, beam portions 5004 formed in the third area, hole portions 5005 formed in the sixth area, and etching openings 5006 defined in the fourth area. The frame portion 5001 comprises the first semiconductor layer 4801 and the metal layer 4804 and is shaped in the form of a frame having a predetermined thickness in the center direction from its outer edge sides. Here, the frame portion 5001 is one of plural layers constituting the base portion 4901 and corresponds to the uppermost layer of the base portion 4901. The stopper portions 5002 is configured of the metal layer 4804 and have triangular shapes having two sides which are connected to their corresponding insides of the frame portion 5001 and extend out from the corners of the inner wall of the frame portion 5001 to the center. The weight portion 5003 is made up of the first semiconductor layer and is rectangular in shape and placed in the center of the first layer 4805. That is, the center of the weight portion 5003 is placed with distances substantially equal from the respective sides located at the outer edge portions of the first layer 4805. Here, the weight portion 5003 is part of a layer constituting the weight portion 4902 and corresponds to its uppermost layer. The beam portions 5004 are respectively composed of the first semiconductor layer 4801 and are rectangular in shape and connect the frame portion 5001 and the weight portion 5002. Here, the thickness of each beam portion from its lower surface to its upper surface is configured with a thickness thinner than the thickness of each stopper portion from its lower surface to its upper surface. The hole portions 5005 are respectively spaces surrounded by the frame portion 5001, the stopper portions 5002, the weight portion 5003 and the beam portions 5004. Here, the hole portions 5005 are parts of the opening 4903. The etching openings 5006 are a plurality of small through holes defined to allow etchant to pass therethrough and etch the layers below the stopper portions 5002.

Figure 51:
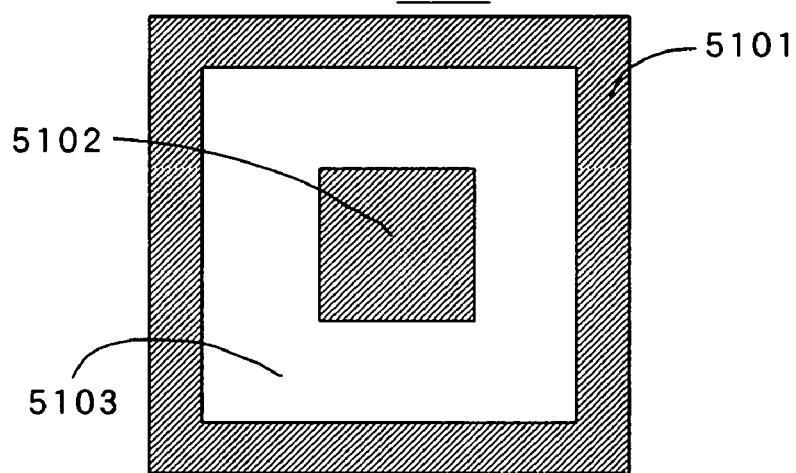
FIG. 51 is a top view illustrating a first insulator layer of the acceleration sensor according to the fourth embodiment of the present invention.
Figure 52:
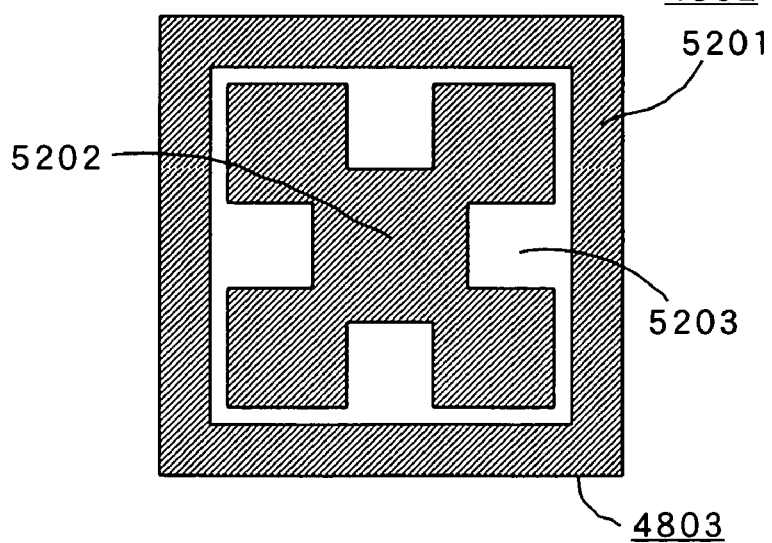
FIG. 52 is a top view depicting a second semiconductor layer of the acceleration sensor according to the fourth embodiment of the present invention.

Since FIGS. 51 and 52 show the same structures as those in FIGS. 40 and 41 of the third embodiment, the description thereof is omitted here.

The base portion 4901 of the acceleration sensor according to the fourth embodiment of the present invention comprises the frame portion 5001 of the first semiconductor layer 4801, the frame portion 5101 of the first insulator layer 4802, and the frame portion 5201 of the second semiconductor layer 4803. The base portion 4901 constitutes the side surfaces of the acceleration sensor of the present invention. The weight portion 4902 comprises the weight portion 5003 of the first semiconductor layer 4801, the weight portion 5102 of the first insulator layer 4802 and the weight portion 5203 of the second semiconductor layer 4803 and is disposed inside the base portion 4901. The weight portion 4903 is a rectangular parallelepiped having upper, lower and side surfaces. The upper surface thereof is connected to the beam portions 4905, and the side surfaces thereof are formed with concave portions defined in the central parts from the upper surface to the lower surface. The lower surface of the weight portion 4903 is located on the upper side than the lower surface of the base portion 4901. The opening 4903 with the stopper portions 4904 and the beam portions 4905 formed therein is formed by the hole portions 5005 corresponding to components of the first semiconductor layer 4801 and the hole portion 5103 corresponding to a component of the first insulator layer 4802. The opening 4903 is a space surrounded by the base portion 4901, the weight portion 4902, the stopper portions 4904 and the beam portions 4905. Each of the stopper portions 4904 formed by the opening 4903 is formed of the metal layer 4805 and shaped in triangular form so as to cover the corners of the base portion 4901 shaped in frame form. Each of the beam portions 4905 formed by the opening 4803 is formed in the first semiconductor layer 4801 and shaped in rectangular form so as to connect the base portion 4901 and the weight portion 4902. Here, the thickness of each beam portion from its lower surface to its upper surface is configured with a thickness thinner than the thickness of each stopper portion from its lower surface to its upper surface.

The acceleration sensor according to the fourth embodiment of the present invention results in an acceleration sensor more resistant to vertical impact owing to the use of the metal layer in a stopper layer as well as having the effect of the third embodiment. Another effect is brought about in that an acceleration sensor more excellent in impact resistance can be formed because the first layer is etched to form the metal film thereby to make it possible to design the thickness of each stopper portion regardless of the SOI wafer. A further effect is brought about in that since the thickness of each beam portion can be provided thinner than the thickness of each stopper portion formed of the metal, the sensitivity of an acceleration sensor can be enhanced while impact resistance is being improved.

Manufacturing Method

A method of manufacturing the acceleration sensor according to the fourth embodiment of the present invention will be explained below using FIG. 48 and FIGS. 53 through 59.

A method of manufacturing the acceleration sensor using the laminated substrate shown in FIG. 48, i.e., a method of manufacturing an acceleration sensor equipped with a base portion having an inner wall, a weight portion located inside the base portion and disposed away from the inner wall of the base portion, flexible beam portions placed over the upper portion of the base portion and the upper portion of the weight portion, and stopper portions which are fixed to the base portion and disposed over the weight portion and away from the weight portion and which restrict the amount of displacement of the weight portion in the vertical direction, comprises a step for forming a mask on each of the stopper portions, a step for removing parts of the beam portions, a step for forming a mask on the lower surface of the base portion, a step for removing part of the weight portion, a step for forming a mask on each beam portion, and a step for forming each stopper portion by metal plating.

FIGS. 53 through 59 show a process for manufacturing the acceleration sensor of the present invention and illustrate a process in which a section taken along line A-A' of FIG. 48 is formed.

Figure 53:
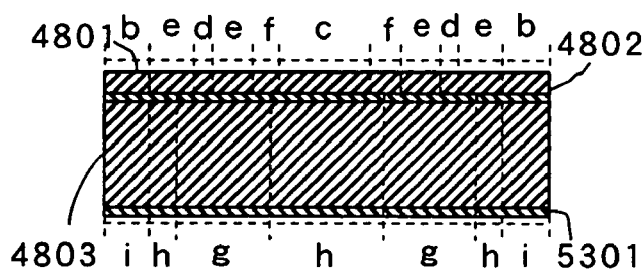
FIG. 53 is a view for describing a method of manufacturing the acceleration sensor according to the fourth embodiment of the present invention.

In the present embodiment, an SOI substrate obtained by laminating a first semiconductor layer 4801, a first insulator layer 4802, a second semiconductor layer 4803 and a second insulator layer 5301 on one another as shown in FIG. 53 is used. The second insulator layer 5301 is formed directly below the second semiconductor layer 4803 and is composed of a silicon oxide film having a thickness of 2 μm, for example. The SOI substrate has upper and lower surfaces. The upper surface of the SOI substrate includes a first area, a second area that surrounds the first area away from the first area, a third area that connects the first area and the second area, a fourth area disposed between the first area and the second area, a fifth area which surrounds the fourth area and makes contact with the second area, and a sixth area surrounded by the first area, the second area, the third area and the fifth area. The lower surface of the SOI substrate has a seventh area, an eighth area that surrounds the seventh area, and a ninth area which is identical in shape to the second area of the upper surface of the SOI substrate and formed directly below the second area. FIGS. 53 through 59 show the section taken along line A-A' of FIG. 48. A third area c located in the center thereof, sixth areas f adjacent to both sides of the third area c, fifth areas e adjacent to the outsides of the sixth areas f, fourth areas d adjacent to the outsides of the fifth areas e, fifth areas e adjacent to the outsides of the fourth areas d, and second areas b adjacent to the outsides of the fifth areas e are placed in the upper surface of the SOI substrate as viewed in the section taken along line A-A'. An eighth area h, seventh areas g adjacent to both sides of the eighth area h, eighth areas h adjacent to the seventh areas g, and ninth areas i adjacent to the eighth areas h are located in the lower surface of the SOI substrate as viewed in the section taken along line A-A'. Here, the ninth areas i are identical in shape to the second areas b and formed directly below the second areas b. As to parts related to the present embodiment identical in manufacturing method to the third embodiment, the description of their detailed manufacturing method is omitted here.

Since the manufacturing method shown in FIG. 53 is similar to the first embodiment, the description of its detailed manufacturing method is omitted.

Figure 54:
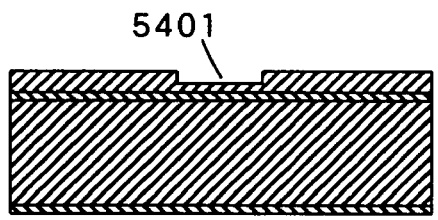
FIG. 54 is a view for describing the method of manufacturing the acceleration sensor according to the fourth embodiment of the present invention.

Next, as shown in FIG. 54, the first semiconductor layer 4801 in the third area of the SOI substrate is subjected to a Photolithographic Process so as to leave the thickness of each beam portion 4905 as it is to thereby form a trench 5401 corresponding to a first trench.

Next, a piezo resistive element is formed on each beam portion 4905. Since a process step for forming the piezo resistive element on the beam portion is similar to the first embodiment, the description thereof is omitted here.

Figure 55:
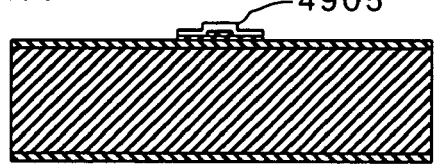
FIG. 55 is a view for describing the method of manufacturing the acceleration sensor according to the fourth embodiment of the present invention.

Next, as shown in FIG. 55, portions, which serve as the weight portion 5003 and beam portions 5004, are left in the first semiconductor layer 4801 in the fourth, fifth and sixth areas by the Photolithographic Process, and other silicon films are removed.

Figure 56:
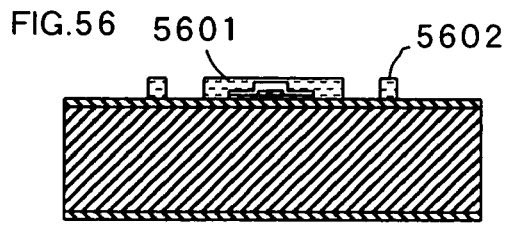
FIG. 56 is a view for describing the method of manufacturing the acceleration sensor according to the fourth embodiment of the present invention.

Next, as shown in FIG. 56, a photosensitive resin, e.g., polyimide is applied onto the first insulator layer 4802 in the first, third, fourth and sixth areas to form an opening pattern 5601 and etching opening patterns 5602.

Figure 57:
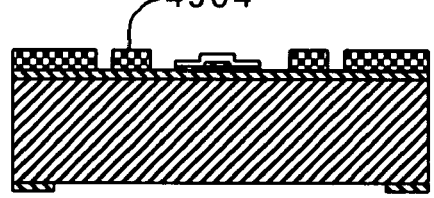
FIG. 57 is a view for describing the method of manufacturing the acceleration sensor according to the fourth embodiment of the present invention.
Figure 58:
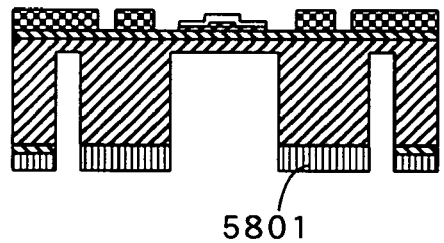
FIG. 58 is a view for describing the method of manufacturing the acceleration sensor according to the fourth embodiment of the present invention.
Figure 59:
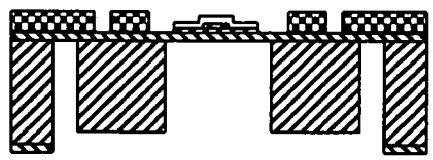
FIG. 59 is a view for describing the method of manufacturing the acceleration sensor according to the fourth embodiment of the present invention.

Next, as shown in FIG. 57, a seed layer for copper electrolytic plating is formed on the first insulator layer 4802 in the fifth area by a sputtering method or the like. After the formation of the seed layer, the copper electrolytic plating is done to form stopper portions 4904.

Next, the photosensitive resin formed on the first insulator layer 4802 in the first, third, fourth and sixth areas is removed to form first and second hole portions, thereby removing the etching opening patterns 5602 and the opening pattern 5601. By adjusting the thickness of each of the opening pattern 5601 and the etching opening patterns 5602 and the thickness of copper by electrolytic plating, the thickness of each stopper portion 4904 can be controlled arbitrarily.

Since the subsequent process steps are similar to the third embodiment, they are omitted here.

The foregoing process steps complete such an acceleration sensor having a stopper structure as shown in FIG. 49, according to the present embodiment.

In addition to the effect of the above embodiment, the method of manufacturing the acceleration sensor according to the fourth embodiment of the present invention has the effect that the metal layer is formed to thereby make it possible to freely design the thickness of each stopper portion without depending on the thickness of the SOI wafer. Also the method has the effect that since the thickness of each of the stopper portions formed of the metal can be formed thicker than the thickness of each beam portion, the sensitivity of the acceleration sensor can be enhanced while impact resistance is being improved.

Although the present invention has been explained above on the basis of the above embodiments, the present invention is not limited to the embodiments. Various changes can be made thereto within the scope not departing from the gist thereof.

Figure 60:
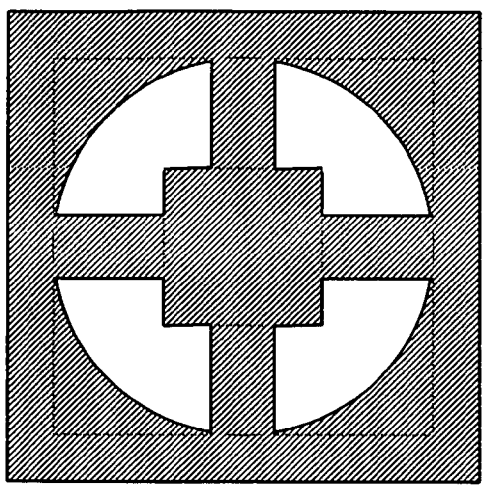
FIG. 60 is a view for describing a modification of a stopper portion for an acceleration sensor of the present invention.
Figure 61:
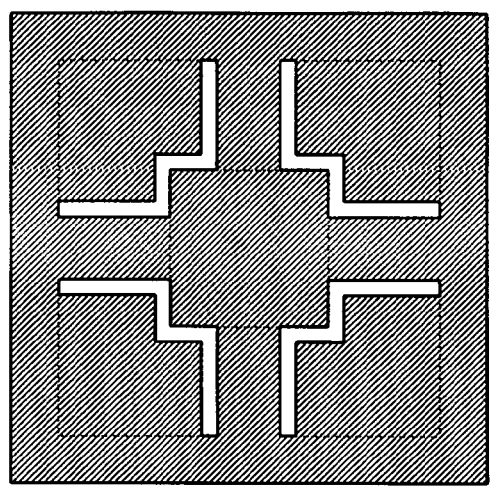
FIG. 61 is a view for describing a modification of a stopper portion for the acceleration sensor of the present invention.
Figure 62:
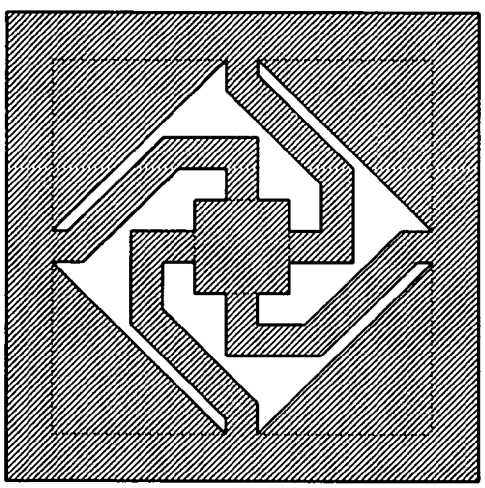
FIG. 62 is a view for describing a modification of a beam portion for the acceleration sensor of the present invention.

The shape is changed such that top views respectively take FIGS. 60, 61 and 62, for example, thereby setting the width and length of each beam portion both of which exercise a great influence on the sensitivity of an acceleration sensor and the shape of each stopper portion, which greatly influences impact resistance, whereby an effect is brought about in that the sensitivity of the acceleration sensor can be improved and the impact resistance can be enhanced. A further effect is brought about in that since no stopper portions are formed above the beam portions, there is not a breakage of each beam portion from the collision of the beam portion with its corresponding stopper portion due to the displacement of each beam portion, and an acceleration sensor having high reliability can be obtained.

According to FIG. 60, a side that connects a first point connecting a beam portion and a base portion and a second point, which connects the other beam portion adjacent to the beam portion and the base portion and is provided in the neighborhood of the first point, is shaped in the form of an arc that connects the first point and the second point. The stopper portion takes such a shape that it extends out to above the side from the base portion. An acceleration sensor having the stopper portions each having such a shape has effect that since the area to be etched becomes wide while an effect similar to the above embodiment is being obtained, a higher reliable acceleration sensor can be obtained.

According to FIG. 61, a side that connects a first point and a second point is formed in such a shape as to extend out to a side provided along a beam portion and a weight portion. Each of stopper portions takes such a shape that it extends out to above the side from a base portion. Thus, an effect is brought about in that the stopper portion can be designed so as to become as large as possible, and the reliability of the stopper portion is more enhanced.

According to FIG. 62, there are provided a first point at which a weight portion and a beam portion are connected, a second point corresponding to an intersecting point of both a straight line connecting the first point and the point of center formed on the upper surface of the weight portion, and a base portion, and a third point disposed in a position different from the second point on the base portion. The beam portion has such a shape as to be formed over the first point and the third point. An effect is brought about in that the beam portion can be designed so as to be longer than one employed in the above embodiment, and the sensitivity of an acceleration sensor can be more improved.

In general, an acceleration sensor displaces a weight portion according to the inertia force of the weight portion when much acceleration is applied, and detects stress applied to each beam portion at this time, through the use of a piezo resistive element to thereby measure acceleration. When the amount of displacement of the weight portion in the vertical direction increases due to the much acceleration at this time, the beam portions displaced in association with the weight portion exceed the allowable amount of displacement in the conventional acceleration sensor, so that the beam portions are damaged. The present invention has the effect that even if the amount of displacement of the weight portion increases due to much acceleration, the beam portions displaced in association with the weight portion do not reach an amount of displacement greater than or equal to a given amount by virtue of stoppage of the weight portion by stopper portions, thereby making it possible to obtain a three-dimensional acceleration sensor high in impact resistance.

The measurement of the acceleration by the stress applied to each beam portion is to measure acceleration on the basis of the resistance value of the piezo resistive element provided on each beam portion, at the time that it is deformed by the stress. Thus, the sensitivity of the acceleration sensor is improved as the beam portions are easy to displace. It is possible to make it easier to displace each beam portion by thinning the thickness thereof, lengthening its length and narrowing its width. In the present invention, each of the beam portions becomes easy to displace by thinning of the beam portion. Even if the weight portion would be displaced due to slight acceleration, the amount of displacement of each beam portion moved in interlock with the weight portion becomes large, so an acceleration sensor having higher sensitivity can be obtained. Further, the present invention also discloses means for increasing the length of each beam in a restricted space by contrivances made to the shape of the beam portions. Combining these with a contrivance made to the thickness of each beam portion enables a more increase in the amount of displacement of the beam portion. Accordingly, the acceleration sensor of the present invention has the effect that the sensitivity thereof can be improved without relying on the mass of the weight portion.

Further, the present invention has the effect that when the stopper portions are made thick and impact resistance is made high since the thickness of each beam portion can be made thinner than the thickness of each stopper portion, the thickness of the beam portion does not result in thickness similar to the stopper portion correspondingly either, thus making it possible to obtain a highly sensitive acceleration sensor with high impact resistance.

These characteristics are sufficiently adapted to the demand for making a size reduction simultaneously with an improvement in sensitivity.

This application is based upon and claims the benefit of priority from prior Japanese Patent Application No. 2004-166007, filed on Jun. 3, 2004 in Japan, the entire contents of which are incorporated herein by reference.

What is claimed is:

1. An acceleration sensor having a laminated substrate including a first layer and a second layer disposed on the first layer, comprising:
   a base portion constituting a portion of the first layer and a portion of the second layer, the base portion having an upper and a lower surface, an opening being defined inside the base portion, the opening extending from the upper surface to the lower surface;
   a weight portion constituting a portion of the first layer and disposed away from the base portion and within the opening;
   flexible beam portions constituting a portion of the first layer and connected to an upper portion of the base portion and an upper portion of the weight portion; and
   stopper portions constituting a portion of the second layer and protruding from the base portion toward the opening, each of the stopper portions being disposed above and away from the first layer of the weight portion and restricting an amount of displacement of the weight portion in the direction of each of the stopper portions,
   wherein a thickness of each of the flexible beam portions is smaller than a thickness of each of the stopper portions.

2. The acceleration sensor according to claim 1, wherein the second layer is an uppermost layer of the laminated substrate, and wherein each of the stopper portions protrudes from an uppermost portion of an inner wall of the base portion and is disposed so as to cover a part of the opening which corresponds to a corner of an inside of the base portion.

3. The acceleration sensor according to claim 1, wherein the base portion has an inner wall at a boundary surface between the base portion and the opening, and wherein the stopper portions are placed within the opening and located above the weight portion, and are provided on the inner wall in the opening and cover part of the weight portion.

4. The acceleration sensor according to claim 1, wherein the stopper portions are not formed above the beam portions.

5. The acceleration sensor according to claim 1, wherein the first layer is disposed below the second layer.

6. The acceleration sensor according to claim 1, wherein a lower surface of the weight portion is formed above the lower surface of the base portion.

7. The acceleration sensor according to claim 1, wherein the stopper portions are respectively formed of a metal.

8. The acceleration sensor according to claim 1, wherein the second layer is formed of a metal and a semiconductor.

9. The acceleration sensor according to claim 1, wherein the first layer is formed of a semiconductor, and the acceleration sensor further includes piezo resistive elements each of which is formed in the beam portion and detects acceleration, and electrode pads formed over the base portion and electrically connected to the piezo resistive elements.

10. An acceleration sensor having a laminated substrate including a first layer and a second layer formed on the first layer, comprising:
    a base portion constituting a portion of the first layer and a portion of the second layer, the base portion having an upper and a lower surface, an opening being defined inside the base portion, the opening extending from the upper surface to the lower surface;
    a weight portion constituting a portion of the first layer and a portion of the second layer, the weight portion being disposed within the opening away from the base portion;
    flexible beam portions constituting a portion of the second layer and connected to the second layer of the base portion and the second layer of the weight portion; and
    stopper portions constituting a portion of the second layer and protruding from the base portion toward the opening, each of the stopper portions being disposed above the first layer of the weight portion and away from the weight portion and restricting an amount of displacement of the weight portion in the direction of each of the stopper portions,
    wherein a thickness of each of the flexible beam portions is smaller than a thickness of each of the stopper portions.

11. The acceleration sensor according to claim 10, wherein each of the stopper portions protrudes from the second layer of the base portion and is disposed so as to cover a part of the opening which corresponds to a corner of an inside of the base portion.

12. The acceleration sensor according to claim 10, wherein the base portion has an inner wall at a boundary surface between the base portion and the opening, and wherein the stopper portions are placed within the opening and provided on the inner wall in the opening, and cover part of the weight portion.

13. The acceleration sensor according to claim 10, wherein a lower surface of the weight portion is formed above the lower surface of the base portion.

14. The acceleration sensor according to claim 10, wherein the stopper portions are respectively formed of a metal.

15. The acceleration sensor according to claim 10, wherein the second layer is formed of a metal and a semiconductor.

16. The acceleration sensor according to claim 10, wherein the first layer is formed of a semiconductor, and the acceleration sensor further includes piezo resistive elements each of which is formed in the beam portion and detects acceleration, and electrode pads formed over the base portion and electrically connected to the piezo resistive elements.

17. An acceleration sensor having a laminated substrate including a first layer, a second layer formed on the first layer and a third layer formed on the second layer, comprising:
   a base portion constituting a portion of the first layer, a portion of the second layer and a portion of the third layer, wherein the laminated substrate has an upper surface and a lower surface and an opening extending from the upper surface to the lower surface, and wherein the opening is defined inside the base portion;
   a weight portion constituting a portion of the first layer and a portion of the second layer, the weight portion being disposed within the opening away from the base portion;
   flexible beam portions constituting a portion of the second layer and connected to the second layer of the base portion and the second layer of the weight portion; and
   stopper portions constituting a portion of the third layer and protruding from the base portion toward the opening, each of the stopper portions being disposed above the first layer of the weight portion and away from the weight portion and restricting an amount of displacement of the weight portion in the direction of each of the stopper portions,
   wherein a thickness of the second layer is smaller than a thickness of the third layer.

18. The acceleration sensor according to claim 17, wherein each of the stopper portions protrudes from the third layer of the base portion and is disposed so as to cover a part of the opening which corresponds to a corner of an inside of the base portion.

19. The acceleration sensor according to claim 17, wherein the base portion has an inner wall at a boundary surface between the base portion and the opening, and wherein the stopper portions are placed within the opening and provided on the inner wall in the opening, and cover part of the weight portion.

20. The acceleration sensor according to claim 17, wherein a lower surface of the weight portion is formed above the lower surface of the base portion.

21. The acceleration sensor according to claim 17, wherein the stopper portions are respectively formed of a metal.

22. An acceleration sensor having a laminated substrate including a first layer, a second layer formed on the first layer and a third layer formed on the second layer, comprising:
   a base portion constituting a portion of the first layer, a portion of the second layer and a portion of the third layer, wherein the laminated substrate has an upper surface and a lower surface and an opening extending from the upper surface to the lower surface, and wherein the opening is defined inside the base portion;
   a weight portion constituting a portion of the first layer, a portion of the second layer, and a portion of the third layer, the weight portion being disposed within the opening away from the base portion;
   flexible beam portions constituting a portion of the third layer and connected to the third layer of the base portion and the third layer of the weight portion; and
   stopper portions constituting a portion of the third layer and protruding from the base portion toward the opening, each of the stopper portions being disposed above the first layer of the weight portion and away from the weight portion and restricting an amount of displacement of the weight portion in the direction of each of the stopper portions,
   wherein a thickness of each of the flexible beam portions is smaller than a thickness of each of the stopper portions.

23. The acceleration sensor according to claim 22, wherein each of the stopper portions protrudes from the third layer of the base portion and is disposed so as to cover a part of the opening which corresponds to a corner of an inside of the base portion.

24. The acceleration sensor according to claim 22, wherein the base portion has an inner wall at a boundary surface between the base portion and the opening, and wherein the stopper portions are placed within the opening and provided on the inner wall in the opening, and cover part of the weight portion.

25. The acceleration sensor according to claim 22, wherein a lower surface of the weight portion is formed above the lower surface of the base portion.

26. The acceleration sensor according to claim 22, wherein the stopper portions are respectively formed of a metal.

* * * * *